US012796439B2

(12) United States Patent
Peng et al.

(10) Patent No.: US 12,796,439 B2
(45) Date of Patent: Nov. 10, 2026

(54) METHOD OF MAKING INTEGRATED CIRCUIT WITH BACKSIDE INTERCONNECTIONS

(71) Applicant: TAIWAN SEMICONDUCTOR MANUFACTURING COMPANY, LTD., Hsinchu (TW)

(72) Inventors: Shih-Wei Peng, Hsinchu (TW); Te-Hsin Chiu, Hsinchu (TW); Wei-An Lai, Hsinchu (TW); Ching-Wei Tsai, Hsinchu (TW); Jiann-Tyng Tzeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 220 days.

(21) Appl. No.: 18/448,072

(22) Filed: Aug. 10, 2023

(65) Prior Publication Data

US 2023/0395503 A1 Dec. 7, 2023

Related U.S. Application Data

(62) Division of application No. 17/241,785, filed on Apr. 27, 2021, now Pat. No. 12,218,057.

(51) Int. Cl.
*H10W 20/41* (2026.01)
*H10D 30/01* (2025.01)
(Continued)

(52) U.S. Cl.
CPC ........ *H10W 20/427* (2026.01); *H10D 30/031* (2025.01); *H10D 30/6713* (2025.01); *H10D 30/6735* (2025.01); *H10D 30/6757* (2025.01); *H10D 62/118* (2025.01); *H10D 64/017* (2025.01); *H10D 84/0167* (2025.01);
(Continued)

(58) Field of Classification Search
CPC ............... H10D 84/0186; H10D 84/85; H10D 30/6757; H10D 64/017; H10D 62/118; H10D 84/0167; H10D 30/6713; H10D 30/6735; H10D 84/017; H10D 84/038; H10D 30/031; H10W 20/427; H10P 14/3452
See application file for complete search history.

(56) References Cited

U.S. PATENT DOCUMENTS

| | | | |
|---|---|---|---|
| 6,214,658 | B1 | 4/2001 | Niuya |
| 7,260,442 | B2 | 8/2007 | Hwang et al. |

(Continued)

*Primary Examiner* — Norman D Richards
*Assistant Examiner* — Sean Ayers Winters
(74) *Attorney, Agent, or Firm* — Hauptman Ham, LLP

(57) ABSTRACT

A method of making an integrated includes steps of etching an opening in an insulating mask to expose a first dummy contact on a backside of the integrated circuit, depositing a conductive material into the opening, the conductive material contacting a sidewall of the first dummy contact, and recessing the conductive material to expose an end of the first dummy contact. The method also includes steps of depositing an insulating material over the conductive material in the opening, removing the first dummy contact from the insulating mask to form a first contact opening, and forming a first conductive contact in the first contact opening, the first conductive contact being electrically connected to the conductive material.

20 Claims, 30 Drawing Sheets

(51) Int. Cl.

| | |
|---|---|
| ***H10D 30/67*** | (2025.01) |
| ***H10D 62/10*** | (2025.01) |
| ***H10D 64/01*** | (2025.01) |
| ***H10D 84/01*** | (2026.01) |
| ***H10D 84/03*** | (2025.01) |
| ***H10D 84/85*** | (2025.01) |
| ***H10P 14/20*** | (2026.01) |

(52) U.S. Cl.
CPC ....... *H10D 84/017* (2025.01); *H10D 84/0186* (2025.01); *H10D 84/038* (2025.01); *H10D 84/85* (2025.01); *H10P 14/3452* (2026.01)

(56) References Cited

U.S. PATENT DOCUMENTS

| | | | | |
|---|---|---|---|---|
| 9,256,709 | B2 | 2/2016 | Yu et al. | |
| 10,269,711 | B1 * | 4/2019 | Liu | H01L 21/76897 |
| 2014/0040838 | A1 | 2/2014 | Liu et al. | |
| 2015/0061148 | A1 | 3/2015 | Li | |
| 2015/0278429 | A1 | 10/2015 | Chang | |
| 2018/0174904 | A1 * | 6/2018 | Hsieh | H01L 21/76831 |
| 2019/0097006 | A1 * | 3/2019 | Li | H01L 21/76831 |
| 2019/0197214 | A1 | 6/2019 | Chae et al. | |
| 2020/0035605 | A1 | 1/2020 | Tsai et al. | |
| 2020/0058744 | A1 * | 2/2020 | Wang | H10D 30/6219 |
| 2020/0105752 | A1 | 4/2020 | Liaw | |
| 2020/0119002 | A1 * | 4/2020 | Xie | H10D 30/62 |
| 2020/0286831 | A1 | 9/2020 | Shao et al. | |

* cited by examiner

METHOD OF MAKING INTEGRATED CIRCUIT WITH BACKSIDE INTERCONNECTIONS

PRIORITY CLAIM

This application is a divisional of U.S. application Ser. No. 17/241,785, filed Apr. 27, 2021, now U.S. Pat. No. 12,218,057, issued Feb. 4, 2025, the entire contents of which are hereby incorporated by reference.

BACKGROUND

The shrinking of integrated circuit (IC) devices, and the increasing density of integrated circuit devices on a substrate, produces increasing difficulty of designing and manufacturing interconnect structures between elements of individual devices and between devices of the integrated circuit.

Interconnect structure complexity increases as devices shrink in successive generations of integrated circuits, and closer spacing between interconnects increases the likelihood of manufacturing defects causing device failure. As crowding between interconnect structure elements increases, parasitic capacitance increases, adversely impacting the performance of individual transistors of the integrated circuit. In some integrated circuits, the parasitic capacitance begins to negate the increases in speed associated with shorter channel lengths of transistors.

DETAILED DESCRIPTION

Figure 1A:
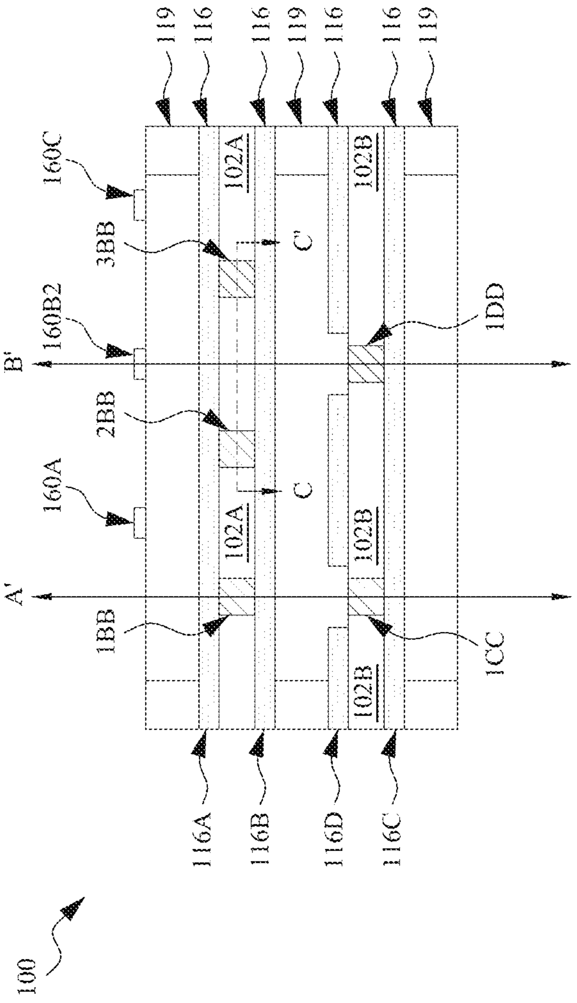
FIG. 1A-1C are bottom views of an integrated circuit, in accordance with some embodiments.

The following disclosure provides many different embodiments, or examples, for implementing different features of the provided subject matter. Specific examples of components, values, operations, materials, arrangements, etc., are described below to simplify the present disclosure. These are, of course, merely examples and are not intended to be limiting. Other components, values, operations, materials, arrangements, etc., are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Manufacturing an integrated circuit having backside contacts and backside interconnects reduces the overall complexity of the interconnect structure on the top side of the integrated circuit. In particular, the first metal layer on the top side of the integrated circuit above the gate electrodes and the source/drain (S/D) contacts becomes increasingly crowded and difficult to manufacture as device dimensions shrink. By adding a set of backside interconnects to an integrated circuit, the complexity of the topside interconnect structure is reduced. Further, a backside interconnect allows for more room between topside interconnects (e.g., lines traversing the circuit), reducing parasitic capacitance in the integrated circuit and providing greater manufacturing flexibility. In a semiconductor device with backside interconnects as described below, the integration scheme is simplified because contacts which connect to circuit elements (e.g., a source or drain or gate electrode of a transistor) are connected to at the side, rather than at the end. By making a side connection between a contact and a backside interconnect, the resistance of the connection is reduced because of the larger area of the contact which electrically connects to the backside interconnect. Further, by making a side-type connection between a contact and a backside interconnect, the manufacturing time for a semiconductor device is reduced because fewer layers of dielectric material are deposited on the backside of the wafer where the semiconductor device is being manufactured.

For purposes of the present disclosure, an integrated circuit which includes transistors has source regions, drain regions, and channels thereof in an active layer of the integrated circuit. The active layer is the first, or lowest, layer of the integrated circuit. The active layer serves as part of a reference for determining whether a side of the integrated circuit is the top side or bottom side of the integrated circuit. In descriptions of elements of the integrated circuit, and the elements of interconnect structures in particular, a proximal end of an element is the end which is closer to the active layer, and the distal end of the element is the end which is farther from the active layer.

A topside of the integrated circuit is a side of the integrated circuit which includes the active layer (e.g., gate electrode and source/drain regions). In FIGS. 1D and 1E, the topside of integrated circuit 100 is the portion extending in the top direction 198 from the reference line 196 at the interface between an active layer 101 and conformal insulating layer portions 116A-116C, including both the active layer 101 and contacts 167 and 168. In FIGS. 1D and 1E, the topside interconnect structure includes contacts and metal lines which meet only at the ends of the contacts. In FIG. 1D, the distal end of contact 167 is electrically connected to metal line 169 and the proximal end of contact 167 is electrically connected to S/D region 104A, and in FIG. 1E, the distal end of contact 168 is electrically connected to conductive line 170 and the proximal end of contact 168 is electrically connected to gate electrode 160B1.

The backside of an integrated circuit is a side of the integrated circuit which is opposite to the active layer. For example, a gate electrode is on a top side of an integrated circuit; and elements on a surface of the integrated circuit opposite the gate electrode are on a backside of the integrated circuit. In FIGS. 1D and 1E, the backside of the integrated circuit 100 does not include active layer 101, and extends in a bottom direction 199 from reference line 196. In integrated circuit 100, the backside of the integrated circuit includes both backside contacts which electrically connect at both ends, and backside contacts which electrically connect at one end and at a sidewall of the backside contact. In some embodiments, a backside interconnect structure includes backside contacts which electrically connect at both ends and at a sidewall of the backside contact.

For example, in FIG. 1D, a proximal end of backside contact 108A is directly against S/D region 106A, and a side of backside contact 108A is directly against backside interconnect 126. A distal end of backside contact 108A is directly against isolation plug 1CC, which electrically isolates backside contact 108A from backside power rail 130. A proximal end of backside contact 1BB is directly against S/D region 104A and a distal end of backside contact 1BB is directly against power rail 131. In FIG. 1E, a proximal end of backside contact 108B is directly against gate electrode 160B2, a side of backside contact 108B is directly against backside interconnect 126. A distal end of backside contact 108B is directly against isolation plug 1DD, which electrically isolates backside contact 108B from backside power rail 130. In integrated circuit 100, the backside of the IC is the portion of the integrated circuit extending in the bottom direction 199 from the reference line 196, including the backside interconnect 126 which electrically connects to the sides of backside contacts 108A-108B, and excluding the active layer 101.

Figure 1B:
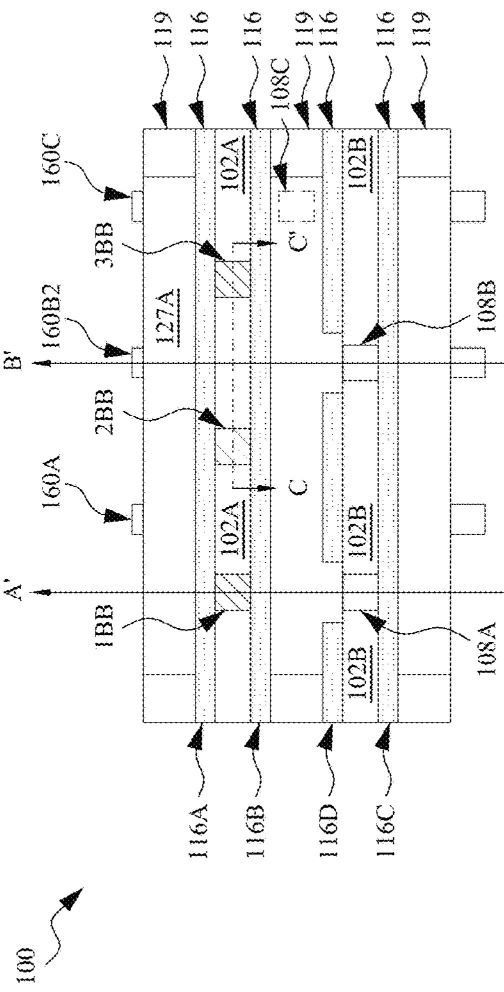
Figure 1C:
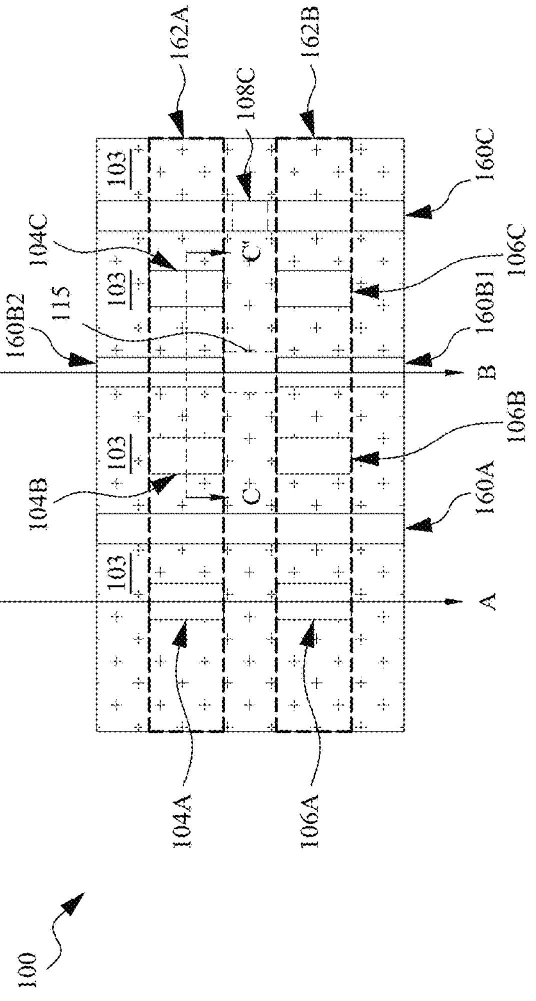
Figure 1D:
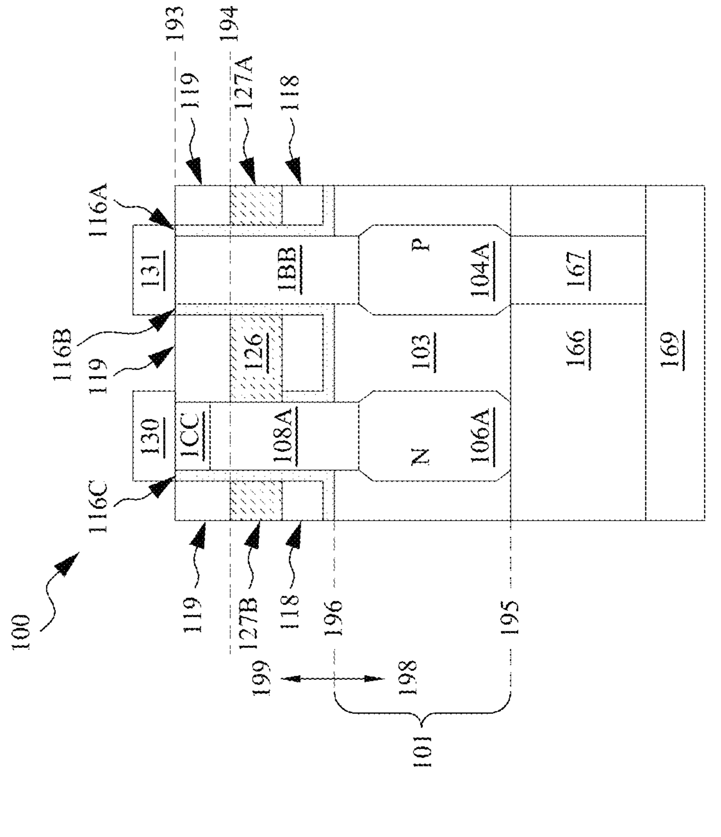
FIGS. 1D-1F are cross-sectional views of an integrated circuit, in accordance with some embodiments.
Figure 1E:
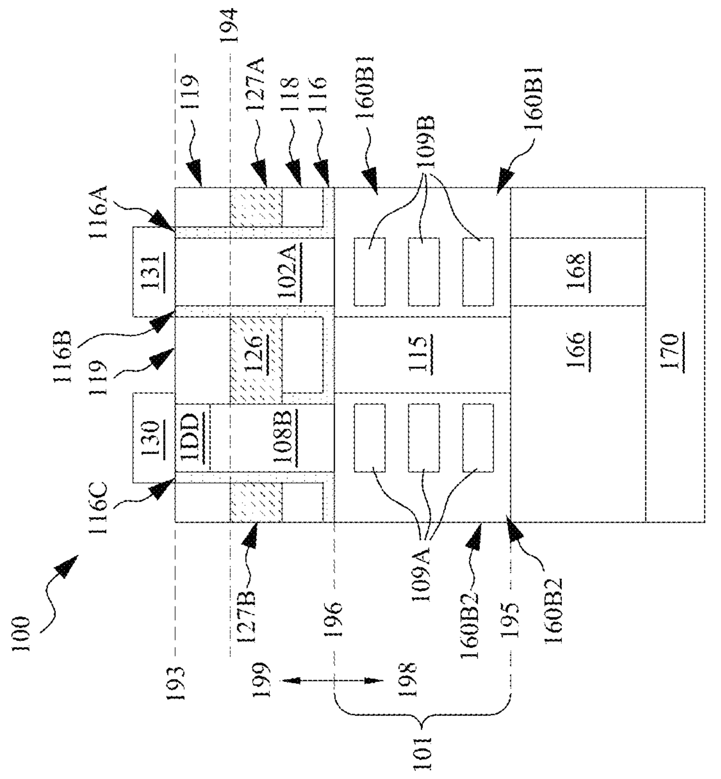
Figure 1F:
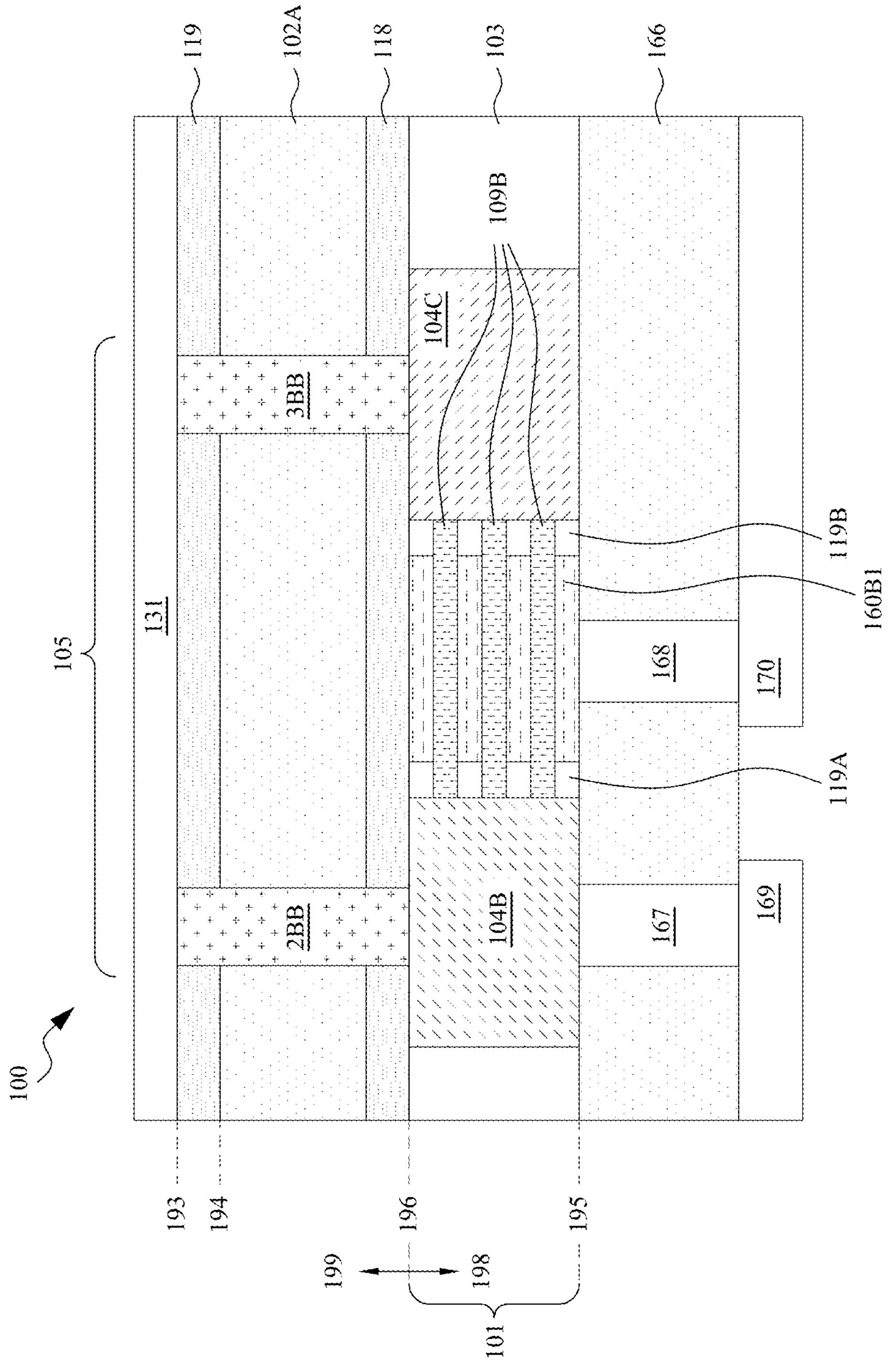

FIGS. 1A-1C are bottom views of an integrated circuit 100, in accordance with some embodiments. FIG. 1A is a bottom view of integrated circuit at reference line 193. FIG. 1B is a bottom view of integrated circuit 100 at reference line 194. FIG. 1C is a bottom view of integrated circuit 100 at reference line 196. The reference lines are indicated on FIGS. 1D and 1E. FIGS. 1D, 1E, and 1F are cross-sectional views of integrated circuit 100. Elements of integrated circuit 100 have consistent numbering in FIGS. 1A-1F for clarity. A personal of ordinary skill, however, will recognize that the embodiment of integrated circuit 100 is one of many embodiments which fall under the scope of the present disclosure.

In FIGS. 1D, 1E, and 1F, reference line 193 is at an interface between the bottom surface of second insulating material 119 and the backside power rail 130. Reference line 194 is at the interface between second insulating material 119 and the backside interconnect 126 (and the conductive material 127A and 127B). Reference line 196 is aligned with an interface between the dielectric material 103 and conformal insulating layer 116. Reference line 195 aligns with the interface between dielectric material 103 and the layer of dielectric material 166 on the top side of the integrated circuit 100.

In FIG. 1A, second insulating material 119 extends across the integrated circuit 100. Conformal insulating layer 116 (or, conformal insulating layer portion 116A and conformal insulating layer portion 116B) separates support material 102A from second insulating material 119. Support material 102B is against conformal insulating layer portion 116C, on one side, and conformal insulating layer portion 116D, at the other side. Insulating material 119 is between conformal insulating layer portion 116D and conformal insulating layer portion 116B. A portion of conformal insulating layer portion 116D has been removed to expose the top surface of support material 102B in the area of isolation plug 1CC and isolation plug 1DD. Support material 102B is separated on both sides from second insulating material 119 by conformal insulating layer 116 (conformal insulating layer portions 116C and 116D. Isolation plug 1CC is located within support material 102B and is against both conformal insulating layer portion 116C and second insulating material 119 (the portion against conformal insulating layer portion 116B). Isolation plug 1DD is located within support material 102B and is against both conformal insulating layer portion 116C and second insulating material 119 (the portion against conformal insulating layer portion 116B). Support material 102B is an insulating material or a dielectric material which electrically isolates a backside power rail 130 (not shown, but directly below/against support material 102B, as in FIGS. 1D-1E) from a remainder of the integrated circuit. The support material is used to form the conformal insulating layer portions extending perpendicular to the interface between the active layer 101 (see FIG. 1D, below). In some embodiments, the support material is a dielectric material such as silicon dioxide, silicon oxy-nitride, or the like. In some embodiments, the support material is a semiconductor material, and source/drain regions of the integrated circuit are grown on exposed portions of the support material, as described below. Isolation plugs 1CC and 1DD electrically isolate backside interconnect 126 (see FIG. 1B, below, and FIGS. 1D-1E) from backside power rail 130. In some embodiments, support material 102A and support material 102B are formed by etching a trench into a support substrate (not shown), the trench being aligned with the positions of active areas of the integrated circuit (including first active area 162A and second active area 162B), and filling the trenches with a dielectric material. The dielectric material for support material 102A and support material 102B is a non-conductive and non-reactive framework against which other materials (e.g., conformal insulating layer 116) are deposited in order to form the backside interconnect structures described below.

Backside contacts 1BB, 2BB, and 3BB extend through support material 102A down to S/D region 104A (see FIG. 1B, FIG. 1C, and FIG. 1D). Backside contact 1BB electrically connects to S/D region 104A (see FIGS. 1C, 1D, and 1F, below). Backside contact 2BB electrically connects to S/D region 104B (see FIGS. 1C and 1F, below). Backside contact 3BB electrically connects to S/D region 104C (see FIGS. 1C and 1F, below). Backside contacts 1BB, 2BB, and 3BB are an electrically conductive material which has been deposited into openings etched through support material 102A. Backside contact 1BB is laterally adjacent to support material 102A on two (opposite) sides, and against conformal insulating layer portion 116A, and conformal insulating layer portion 116B on two (opposite) sides. Backside contact 2BB is laterally adjacent to support material 102A on two (opposite) sides, and against conformal insulating layer portion 116A, and conformal insulating layer portion 116B on two (opposite) sides. Backside contact 3BB is laterally adjacent to support material 102A on two (opposite) sides, and against conformal insulating layer portion 116A, and conformal insulating layer portion 116B on two (opposite) sides. In some embodiments, backside contacts 1BB, 2BB, and 3BB are a semiconductor material which has been deposited into the openings through support material 102A. In some embodiments, backside contacts 1BB, 2BB, and 3BB are a metal-fill type contact, wherein the type of metal fill is selected from tungsten, titanium, cobalt, platinum, palladium, ruthenium, and so forth, or alloys of similar metals compatible with contacts to S/D regions of an integrated circuit.

In FIG. 1B, backside interconnect 126 electrically connects backside contact 108A, backside contact 108B, and backside contact 108C. Backside interconnect 126 is directly against conformal insulating layer portion 116B on one side, and on the opposite side, backside contacts 108A and 108B and conformal insulating layer portion 116D. Backside interconnect 126 electrically connects to an end of backside contact 108C, and to the sides of backside contacts 108A and 108B. Support material 102B separates backside interconnect 126 from conformal insulating layer portion 116C.

Conductive material 127A is separated from support material 102A and backside contacts 1BB and 1CC by conformal insulating layer portion 116A. Conductive material 127B is separated from support material 102B and backside contacts 108A and 108B by conformal insulating layer portion 116C. Second insulating material 119 separates backside interconnect 126 from support material 102B along part of the length of backside interconnect 126. Second insulating material 119 surrounds the ends of conductive material 127A, conductive material 127B, and backside interconnect 126 where the conductive material of conductive material 127A, conductive material 127B, and backside interconnect 126 is not against, or not running parallel to, a portion of support material (e.g., support material 102B) or a conformal insulating layer portion (e.g., conformal insulating layer portions 116A, 116B, and 116C).

In FIG. 1C, gate electrode 160A and gate electrode 160C extend first active area 162A and second active area 162B. Gate electrode 160B2 extends across first active area 162A. Gate electrode 160B1 extends across second active area 162B. Dielectric material 115 separates gate electrode 160B1 from gate electrode 160B2. In some embodiments, dielectric material 115 extends from the edge of first active area 162A closest to second active area 162B, to the edge of second active area 162B. In some embodiments, dielectric material 115 extends from the end of gate electrode 160B1 closest to gate electrode 160B2, to the end of gate electrode 160B2, and the end of gate electrode 160B1 and gate electrode 160B2 are closer to each other than the sides of the first active area and the second active area are to each other.

First active area 162A includes S/D regions 104A, 104B, and 104C. Gate electrode 160A is between S/D region 104A and S/D region 104B. Gate electrode 160B2 is between S/D region 104B and S/D region 104C. S/D region 104C is between gate electrode 160B2 and gate electrode 160C. Second active area 162B includes S/D regions 106A, 106B, and 106C. Gate electrode 160A is between S/D region 106A and S/D region 106B. Gate electrode 160B1 is between S/D region 106B and S/D region 106C. S/D region 106C is between gate electrode 160B1 and gate electrode 160C. Backside contact 108C electrically connects to gate electrode 160C between first active area 162A and second active area 162B. Dielectric material 103 is located around S/D regions 104A-104C, S/D regions 106A-106C. Dielectric material 103 is between the gate electrodes 160A and 160B1 and 160B2, between gate electrodes 160B1 and 160B2 and 160C, and between the S/D regions 104A-104C, S/D regions 106A-106C, and the gate electrodes First active area 162A and second active area 162B are located in an active layer of the integrated circuit (see FIGS. 1D-1E below which describe the active layer 101 in cross sectional views of the integrated circuit 100). Source/drain regions in first active area 162A and second active area 162B align with the support material of support material 102A and support material 102B, such that backside contacts are manufactured in openings through the support material to electrically connect to the source/drain regions of first active area 162A and second active area 162B. Support material is also used as part of self-aligned backside contact formation described below in method 300, operation 310. In some embodiments, the support material remains after backside contacts are formed in the integrated circuit. In some embodiments, the support material is removed and replaced with a different dielectric material (with a different dielectric constant than the support material) to provide enhanced electrical isolation between backside contacts in the backside interconnect structure.

In the active areas, source regions and drain region (S/D regions) and gate electrodes are separated by dielectric material 103. Backside contacts electrically connect to S/D regions and gate electrodes in the active layer. FIG. 1C is a bottom view of integrated circuit 100 at reference line 196. In FIG. 1C, In FIG. 1A, backside contacts 108A, 108B, 108C, 1BB, and 2BB have solid borders to indicate that the backside contacts are on the backside of the integrated circuit. First active area 162A includes S/D regions 104A, 104B, and 104C. Second active area 162B includes S/D regions 106A, 106B, and 106C. A backside contact 1BB is connected to S/D region 104A and is between conformal insulating layer portion 116A and conformal insulating layer portion 116B and within support material 102A along the length of the first active area 162A. A backside contact 1BB is connected to S/D region 104B and is between the conformal insulating layer portion 116A and conformal insulating layer portion 116B and within support material 102A along the length of second active area 162B. An S/D region 104C has no backside contact on the backside of the integrated circuit 100. A backside contact 108A is connected to an S/D region 106A and is between the conformal insulating layer portion 116B and the conformal insulating layer portion 116C. S/D regions 106B and 106C do connect to backside contacts in the integrated circuit 100. A backside contact 108B is directly against a gate electrode 160B2. A signal transmitted through backside contact 108B activates the gate electrode 160B2 after being received through backside interconnect 126. Dielectric material 115 electrically isolates the gate electrode 160B1 in first active area 162A from the gate electrode 160B2 in second active area 162B. Dielectric material 115 is in active layer 101 above (e.g., in the top direction 198) backside interconnect 126. Dielectric material 115 is separated from backside interconnect 126 by insulating material 118 (see FIG. 1E). Conductive material 127C is on an opposite side of first active area 162A from backside interconnect 126, and conductive material 127B is on an opposite side of second active area 162B from backside interconnect 126. Backside interconnect 126 includes the same material as conductive material 127B and 127C. The conductive material 127B and the conductive material 127C are not directly electrically connected to the active areas or the topside interconnect structure of the integrated circuit 100.

In FIG. 1A, cross-sectional line A-A' spans integrated circuit through insulating material 118, conductive material 127C, first active area 162A at S/D region 104A, backside contact 1BB, backside interconnect 126, second active area 162B at S/D region 106A, backside contact 108A, and conductive material 127B (see FIG. 1D, below). Cross-sectional line B-B' spans integrated circuit 100 at insulating material 118, conductive material 127C, first active area 162A at S/D region 104B, backside contact 108A, backside interconnect 126, second active area 162B, S/D region 106B, backside contact 1BB, and conductive material 127A. Cross-sectional line B-B' also spans gate electrodes 160B1 and 160B2, dielectric material 115 (see FIG. 1E, below), backside interconnect 126, conductive material 127A and conductive material 127B, and first active area 162A and second active area 162B. In integrated circuit 100, gate electrodes 160B1 and 160B2 include channel regions which are part of a gate-all-around (GAA), or nanomwire, type transistor structures, where the gate electrode encircles the channel region.

FIG. 1D is a cross-sectional view of integrated circuit 100, in accordance with some embodiments. The cross-sectional view of integrated circuit 100 in FIG. 1B corresponds to a view along cross-sectional line A-A' as described in FIG. 1A. In FIG. 1D, an N-doped S/D region 106A and a P-doped S/D region 104A are embedded in a dielectric material 103 in active layer 101. In some embodiments, the dielectric material between the S/D regions of the IC is deposited after [1] epitaxial growth of the S/D regions and [2] trimming of the S/D regions (described below in FIG. 4E). N-doped S/D region 106A is electrically connected to a backside contact 108A, and a side of backside contact 108A is electrically connected to a backside interconnect 126. An isolation plug 1CC is at a distal end of the backside contact 108A. Backside power rail 130 is electrically isolated from backside contact 108A by isolation plug 1CC and second insulating material 119.

In FIG. 1D, reference line 195 is aligned with an interface between dielectric material 103 and dielectric material 166. A contact 167 extends through layer of dielectric material 166 electrically connecting S/D region 104A to metal line 169. A backside contact 108A extends from S/D region 106A up to isolation plug 1CC and backside power rail 130.

A backside contact 1BB is at a bottom end of the P-doped S/D region 104A. A conformal insulating layer portion 116A extends along the side of the backside contact 1BB and separates the backside contact 1BB from conductive material 127A, second insulating material 119, and first insulating material 118. A conformal insulating layer portion 116B extends along the side of backside contact 1BB opposite from conformal insulating layer portion 116A, and extends across the dielectric material 103, to the side of backside contact 108A. Conformal insulating layer portion 116C extends along the side of backside contact 108A opposite from backside interconnect 126, and separates backside contact 108A from conductive material 127B. Insulating material 118 extends against the lower portions (closer to the S/D regions) of the conformal insulating layer portions 116A-116C. Second insulating material 119 is against the upper portions of the conformal insulating layer portions 116A-116C. Backside interconnect 126 is between insulating material 118, second insulating material 119, conformal insulating layer portion 116B, and the backside contact 108A. A side of backside interconnect 126 is against a distal portion of conformal insulating layer portion 116B adjacent to backside contact 108A. Isolation plug 1CC is directly against a distal end of backside contact 108A. A backside power rail is against isolation plug 1CC.

A layer of dielectric material 166 is at a top end of the S/D region 106A and against the dielectric material 103. A contact 167 extends through an entirety of dielectric material 166. Metal line 169 extend across the surface of dielectric material 166 opposite from the dielectric material 103. A proximal end of contact 167 electrically connects to S/D region 104A, and a distal end of contact 167 electrically connects to metal line 169.

FIG. 1E is a cross-sectional view of integrated circuit 100 along cross-sectional line B-B' as described above in FIGS. 1A-1C. The cross-sectional view extends through channels 109A and 109B and gate electrodes 160B1 and 160B2, and through a dielectric material 115 which electrically isolates gate electrodes 160B1 and 160B2. Gate electrodes 160B1, 160B2, channels 109A and 109B, and dielectric material 115 are in active layer 101 with S/D regions 106A and 104A as described in FIG. 1D. Gate electrode 160B1 is separated from gate electrode 160B2 by a dielectric material 115. Gate electrode 160A surrounds channels 109A, which are part of a gate-all-around (GAA) transistor. A gate dielectric material (not shown) extends around the sides of channels 109A and separates channels 109A from gate electrode 160B1. Gate electrode 160B1 surrounds channels 109B, which are part of a different gate-all-around (GAA) transistor channels 109A. A gate dielectric material (not shown) extends around the sides of channels 109B and separates channels 109B from gate electrode 160B. Gate electrode 160C is directly above backside contact 108C. While FIG. 1E is directed to a GAA transistor, one of ordinary skill in the art would recognize that this application is also applicable to fin field effect transistor (FinFET) technology.

Reference line 196 is aligned with an interface between the conformal insulating layer 116, gate electrode 160B1, dielectric material 115, and gate electrode 160B2. Reference line 195 is aligned with the interface between the dielectric material 166 and dielectric material 115, the gate electrode 160B1, and the gate electrode 160B2. In the top direction 198 from reference line 195, dielectric material 166 covers the gate electrode 160B1, gate electrode 160B2, and the dielectric material 115. A contact 168 extends through layer of dielectric material 166. The proximal end of contact 168 electrically connects to gate electrode 160B1, and a distal end of contact 168 electrically connects to conductive line 170. Conductive line 170 traverses the top side of dielectric material 166.

Conformal insulating layer 116 is against the bottom side of gate electrode 160B1, dielectric material 115, and gate electrode 160B2. Conformal insulating layer 116 is divided into portions: conformal insulating layer portion 116A is against gate electrode 160B1 and the first side of support material 102, conformal insulating layer portion 116B is against the opposite side of support material 102, the dielectric material 115, and the side of backside contact 108A, and conformal insulating layer portion 116C is against the side of backside contact 108B and the gate electrode 160B2. An insulating material 118 against lower parts of the conformal insulating layer portions.

Backside interconnect 126 is against the insulating material 118 between the backside contact 108B and the support material 102. A conductive material 127A is against the insulating material 118 on the opposite side of support material 102A from backside interconnect 126, and conductive material 127B is against the insulating material 118 on the opposite side of backside contact 108B from backside interconnect 126. Backside interconnect 126, conductive material 127A and conductive material 127B are the same conductive material, deposited over the insulating material 118, and recessed to expose the upper portions of the conformal insulating layer 116 during manufacturing. Second insulating material 119 is against the opposite side of conductive material 127A, conductive material 127B, and backside interconnect 126 from insulating material 118. An isolation plug 1DD is at the distal end of backside contact 108B. Backside power rail 130 is against the isolation plug 1DD.

FIG. 1F is a cross-sectional diagram of integrated circuit 100 along cross-sectional line C-C', in accordance with some embodiments. In FIG. 1F, active layer 101 includes dielectric material 103, S/D region 104B (a source) and S/D region 104C (a drain) of transistor 105. Transistor 105 also includes channels 109B extending from S/D region 104B to S/D region 104C. Insulating material 118 is against a bottom side of active layer 101. Support material is on a bottom side of insulating material 118, and is between insulating material 118 and insulating material 119. Backside contact 2BB extends through insulating material 119, support material 102A, and insulating material 118 to make an electrical connection with S/D region 104B. Backside contact 2BB electrically connects S/D region 104B to power rail 131. Backside contact 3BB electrically connects S/D region 104C to power rail 131. Backside contact 3BB extends through insulating material 119, support material 102A, and insulating material 118 to make an electrical connection with S/D region 104C. Gate electrode 160B1 extends through active layer 101 and is against channels 109B. Dielectric material 119A is between S/D region 104B and gate electrode 160B1. Dielectric material 119B is between S/D region 104C and gate electrode 160B1. Contact 168 extends through dielectric material 166 and electrically connects gate electrode 160B1 to conductive line 170. Contact 167 extends through dielectric material 1667 to electrically connect conductive line 169 to S/D region 104B. Transistor 105 conducts electrical current between S/D region 104B and S/D region 104C when a voltage is applied through contact 168 to gate electrode 160B1.

Figure 2:
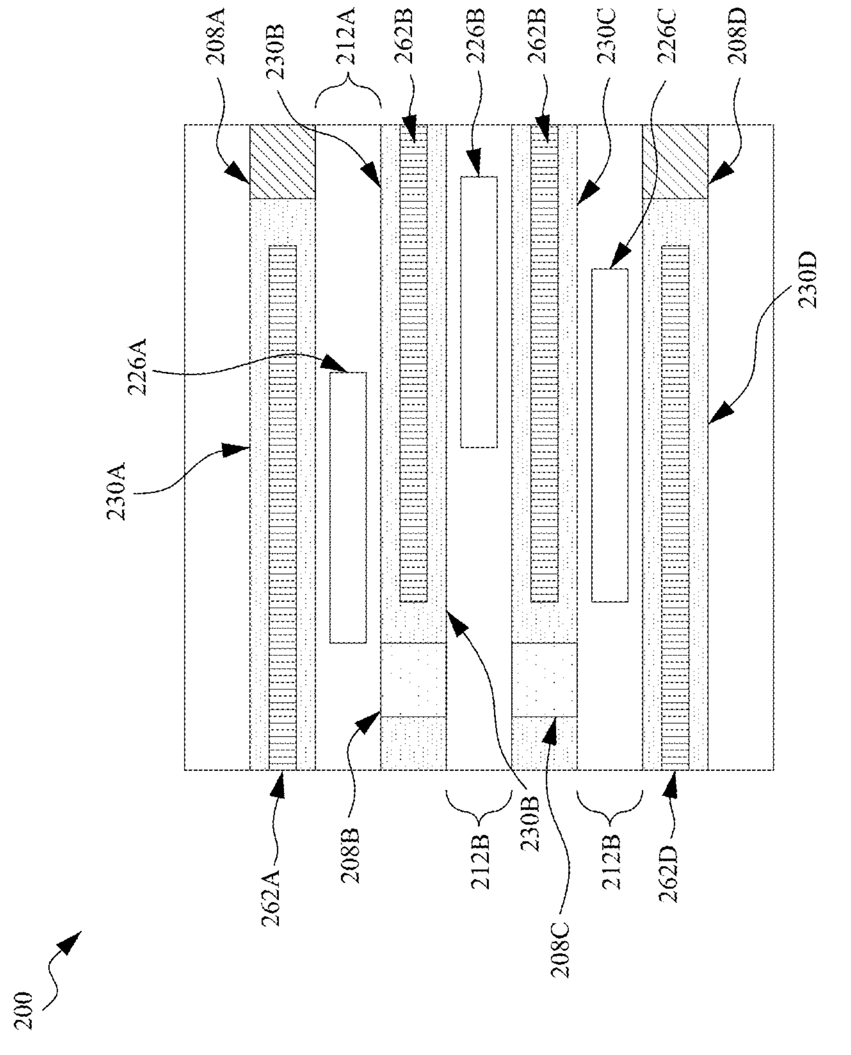
FIG. 2 is a bottom view of an integrated circuit, in accordance with some embodiments.

FIG. 2 is a bottom view of an integrated circuit 200, in accordance with some embodiments. In integrated circuit 200, backside power rails 230A, 230B, 230C, and 230D on a bottom side of the integrated circuit 200 are vertically aligned with active areas of the integrated circuit. Thus, backside power rail 230A is aligned with active area 262A, backside power rail 230B is aligned with active area 262B, backside power rail 230C is aligned with active area 262C, and backside power rail 230D is aligned with active area 262D. Backside power rail 230A electrically connects to a topside interconnect structure by via 208A, backside power rail 230B electrically connects to a topside interconnect structure by via 208B, backside power rail 230C electrically connects to a topside interconnect structure by via 208C, and backside power rail 230D electrically connects to a topside interconnect structure by via 208D.

Layout gap 212A is between active area 262A and active area 262B, layout gap 212B is between active area 262B and active area 262C, and layout gap 212C is between active area 262C and active area 262D. Backside interconnect 226A is within layout gap 212A, backside interconnect 226B is within layout gap 212B, and backside interconnect 226C is within layout gap 212C. In integrated circuit 200, active area 262A and active area 262D are doped to function as N-type transistors and active areas 262B and 262C are doped to function as P-type transistors.

Backside interconnects are compatible with interconnections between same-dopant type active areas (e.g., N-type to N-type or P-type to P-type) as well as interconnections between active areas with different dopant types (e.g., N-type and P-type active areas). Thus, backside interconnect 226A is configured to electrically connect elements of an N-type transistor in active area 262A with elements of a P-type transistor in active area 262B. Backside interconnect 226C is configured to electrically connect elements of a P-type transistor in active area 262C with elements of an N-type transistor in active area 262D. Backside interconnect 226B is configured to electrically connect elements of a P-type transistor in active area 262B with elements of a P-type transistor in active area 262C. FIGS. 4K-4M, and 5K-5M, presented below, provide additional discussion of the process of forming backside contact and backside interconnects as described above in FIGS. 1A-1E. Backside power rails are further discussed below in FIGS. 4P and 5B. Backside power rails are embedded in a dielectric material which sits against a layer of the integrated circuit having the backside interconnects and backside contacts therein.

Figure 3:
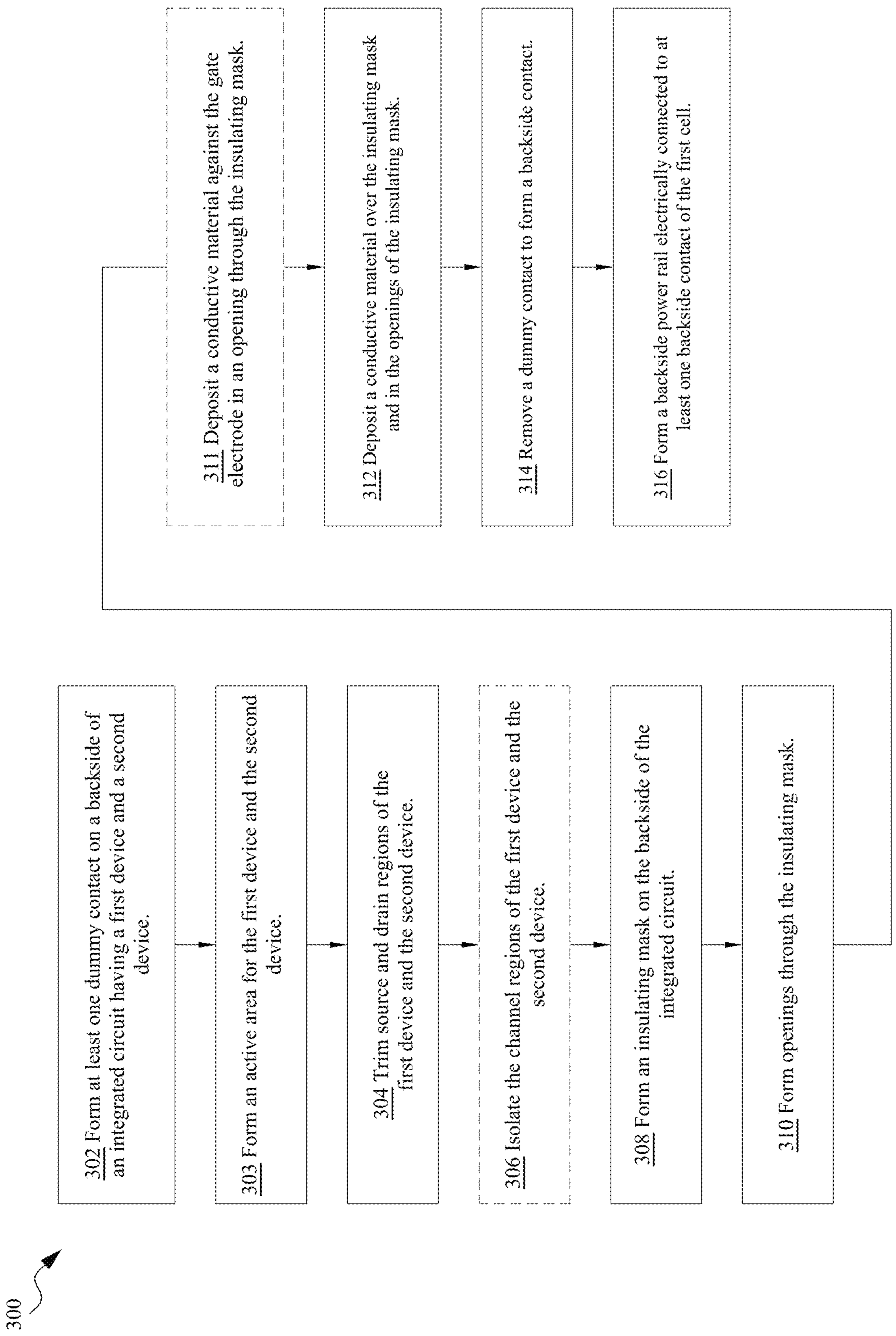
FIG. 3 is a flow diagram of a method of making an integrated circuit, in accordance with some embodiments.
Figure 5A:
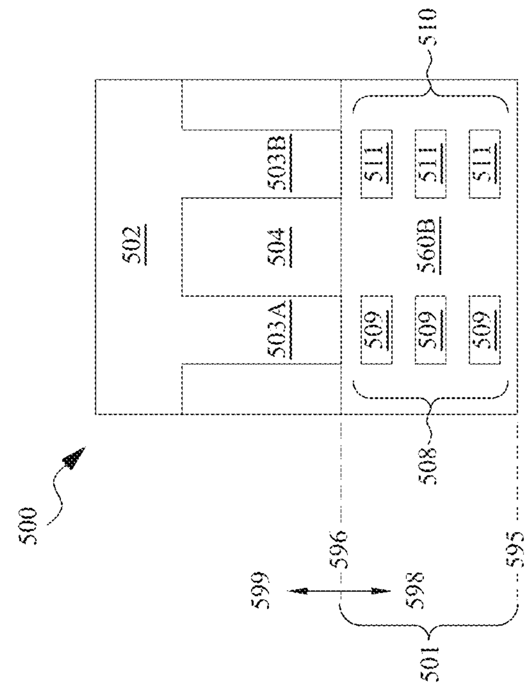
FIGS. 5A-5U are cross-sectional views through a gate-electrode region of an integrated circuit at various stage of production, in accordance with some embodiments.
Figure 4A:
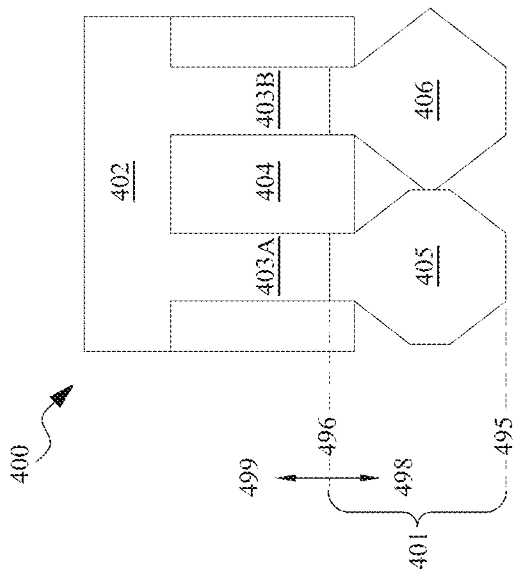
FIGS. 4A-4P are cross-sectional views through a source/drain region of an integrated circuit at various stages of production, in accordance with some embodiments.

FIG. 3 is a flow diagram of a method 300 of making an integrated circuit, in accordance with some embodiments. FIGS. 4A-4P, below, describe cross-sectional views of S/D regions in embodiments of integrated circuits made according to method 300. FIGS. 5A-5U, below, describe cross-sectional views of gate electrodes/channel regions in embodiments of integrated circuits made according to method 300. Elements of integrated circuit 500 having a similar function and/or structure as a corresponding element in integrated circuit 400 have a same identifying numeral, incremented by 100.

Method 300 includes an operation 302, wherein at least one dummy contact is formed on a backside of an integrated circuit having a first device and a second device, in accordance with some embodiments. Forming a backside contact and backside interconnects includes the manufacture of dummy contacts over which the materials of the backside interconnect layer are deposited, and in which backside contacts are formed.

According to some embodiments of the present disclosure, the forming of a dummy contact for an integrated circuit includes [1] at least one step wherein a layer of patterning material is deposited onto a top surface of a support substrate (e.g., a silicon wafer or other material on which the materials of an active layer (see active layer 101 in FIG. 1D and FIG. 1E) are deposited), [2] a step wherein the patterning material receives a transferred pattern (from, e.g., a photolithography tool during a photolithography transfer process), and [3] an etch step wherein the support substrate exposed within openings in the patterning material is removed by, e.g., reactive ion etching. In some embodiments, the dummy contacts are parts of the support material (see support material 102A and 102B in FIGS. 1A-1E) and the support material includes fins which are aligned with and extend in parallel to the active areas of the topside of the integrated circuit (see first active area 162A in FIG. 1C and support material 102A in FIG. 1B), above). In some embodiments, forming the fins of support material occurs before making the S/D regions. In some embodiments, forming fins of the support material occurs after making the S/D regions.

Forming dummy contacts includes steps for forming a hardmask layer at a distal end of the support material (see dummy contacts 403A and 403B in FIG. 4A, with hardmasks 4MA and 4MB at the distal ends thereof). In some embodiments, the distal ends of the dummy contacts are recessed by an etch process (a dry etch process or a wet etch process) which is selective to etch the support material of the dummy contacts. In some embodiments, the opening formed by recessing the dummy contact (or, support material) is filled by depositing a hardmask material. Deposited hardmask materials include silicon carbide, silicon nitride, silicon oxy-nitride, or the like. Other hardmask materials compatible with the method 300 are also included within the scope of the present disclosure. In some embodiments, a hardmask material is grown from the distal end of the recessed dummy contacts/support material. After hardmask formation, the backside is planarized to expose the dielectric material (see dielectric material 504), providing a level surface for subsequent steps.

Method 300 includes an operation 303 in which an active area of the integrated circuit is formed. Forming an active area of an integrated circuit includes steps associated with [1] forming a source and drain region of the active area and steps associated with [2] forming a gate electrode and channel of the active area. Additional information regarding the manufacture of integrated circuits is provided below in the description of FIGS. 13-14.

According to some embodiments, S/D regions of an integrated circuit are masked during the process of forming channels and gate electrodes of the integrated circuit.

According to some embodiments, forming source and drain regions of an active area includes steps associated with masking regions of the integrated circuit associated with the gate electrode and channel, and regions for which the integrated circuit design includes an alternative dopant type, in order to create a S/D region having a first dopant type. For example, when forming N-type S/D regions, the locations of channel/gate electrode regions and the P-type S/D regions are covered by a protective mask layer in order to prevent epitaxial growth of the N-type material on the locations of the channels and P-type S/D regions. Similarly, when forming P-type S/D regions of an integrated circuit, N-type S/D regions (or contacts at such regions) are masked to prevent growth of P-type material at those locations.

According to some embodiments, steps of operation 302 and operation 303 are intermixed. In some embodiments, backside contacts are formed by removing part of the support material to make electrical connections to the S/D regions and/or the gate electrodes of an integrated circuit. In some embodiments, the support material directly against the S/D region or gate electrode is left in place because there is a topside connection to the S/D region or gate electrode. In some embodiments, support material between backside contacts is left in place in the integrated circuit. In some embodiments, the support material between backside contacts is removed, and replaced with a fill material. In some embodiments, the fill material is silicon dioxide, silicon nitride, an organic insulator, or some other fill material compatible with the backside interconnect and backside contacts.

Forming a dummy contact on a backside of an integrated circuit produces embodiments such as FIG. 4A is a cross sectional view following formation of source and drain regions of an active area by, e.g., epitaxial deposition of materials on top sites of dummy contacts. FIG. 5A is a cross sectional view following formation of a channel and gate electrode of active areas in an integrated circuit above the top of dummy contacts.

FIGS. 4A-4B and 5A-5B are cross-sectional views of integrated circuits corresponding to steps of forming a dummy contact on a backside of an integrated circuit according to operation 302, and forming an active area of the integrated circuit according to operation 303, above.

FIG. 4A is a cross-sectional view of an integrated circuit 400 during a manufacturing process after formation of dummy contacts 403A and 403B and filling of openings next to the dummy contacts with a dielectric material 404. Dummy contacts are formed from a same material as substrate 402. In some embodiments, dummy contacts are linear, or fins. In some embodiments, dummy contacts are columnar, or pillar-shaped. In some embodiments, the substrate is a semiconductor wafer. In some embodiments, the substrate is a layer of material deposited onto a semiconductor wafer or other carrier compatible with integrated circuit manufacturing. The topside of integrated circuit 400 and integrated circuit 500 is the portion of the circuit extending in the top direction 198 from the reference line 196. The topside includes the active layer 401 and layers of the integrated circuit beyond the active layer 101, or beyond the reference line 195, in the top direction 198. S/D region 405 is in active layer 401 against dummy contact 403A, and S/D region 406 is against dummy contact 403B. S/D region 405 is an N-doped material. S/D region 406 is a P-doped region. In some embodiments, adjacent S/D regions have a same type of dopant therein (e.g., N-type and N-type, or P-type and P-type).

In FIG. 5A, integrated circuit 500 includes support material 502. Dummy contacts 503A and 503B have been etched from support material 502. Gate electrode 560B is at the proximal end of the dummy contacts 503A and 503B, and the proximal side of dielectric material 504, which fills the spaces between and beside the dummy contacts 503A and 503B. In some embodiments, the gate electrode is made of an undoped semiconductor material. In some embodiments, dummy contacts are linear, or fins. In some embodiments, dummy contacts are columnar, or pillar-shaped. Channels 509 align in the top direction 198 with dummy contact 503A, and channels 511 align in the top direction 198 with dummy contact 503B. Channels 509 and 511 are part of a gate-all-around type transistor. In some embodiments, the active layer includes FinFET-type transistors, or other types of transistors configured to connect to the backside interconnect structure. Channels 509 are part of first channel region 508 and channels 511 are part of channel region 510. In some embodiments, the channels are made of an undoped semiconductor material. Gate electrode and channel materials are selected from intrinsic silicon, polysilicon, gallium arsenide, silicon germanium, or other semiconductor materials familiar to practitioners.

In FIG. 5A, integrated circuit 500 includes gate electrode 560B containing channels 509 in proximity to dummy contact 503A and channels 511 in proximity to dummy contact 503B. Gate electrode 560B is deposited around and between each of the channels 509 in first channel region 508 and around and between each of the channels 511 in channel region 510. In some embodiments, the gate electrode material and the channels are deposited in a plurality of deposition steps, layering gate electrode and channel material. In some embodiments, the channels are formed, a gate dielectric material is formed around the channels, and the gate electrode material is deposited to fill between channels. A dielectric material or gate dielectric is deposited on the outer surfaces of channels 509 and channels 511 to separate the channels from gate electrode 560B.

Figure 4B:
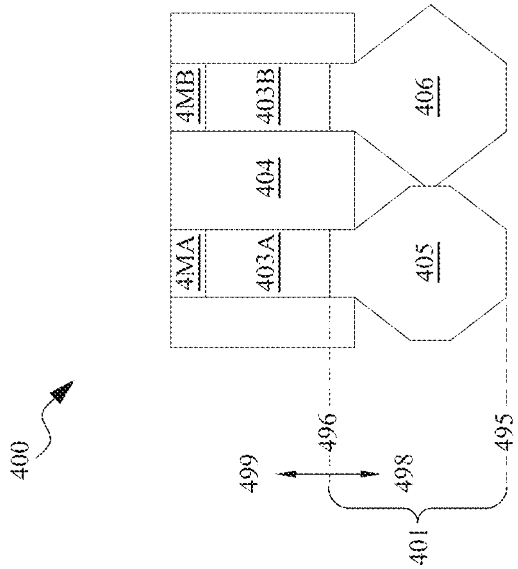

In FIG. 4B, a hardmask 4MA is at the distal end of dummy contact 403A, and a hardmask 4MB is at a distal end of contact dummy 403B. The dummy contacts 403A-403B have been recessed and the opening formed by recessing the dummy contacts has been filled with the hardmask material. Some embodiments, the hardmask material is a layer of carbide, tungsten carbide, or other etch resistant material designed to protect the dummy contact during manufacturing operations. In some embodiments, the hardmask material is deposited by sputtering. In some embodiments, the hardmask material is deposited by CVD or some other deposition technique compatible with method 300. The hardmasks prevent lateral erosion of the dummy contacts during manufacturing to preserve the width of the dummy contacts. A narrow backside contact formed from an eroded dummy contact results in increased circuit resistance, resulting in greater power consumption and slower device performance. Further, a narrow or eroded dummy contact is associated with increased defectively during the manufacture of backside contacts because of difficulty in depositing conductive contact material in the openings formed after removal of the dummy contacts. In some embodiments, the entire length of a dummy contact (when the dummy contact is a fin of support material) is covered by the hardmask at the distal end thereof.

Figure 5B:
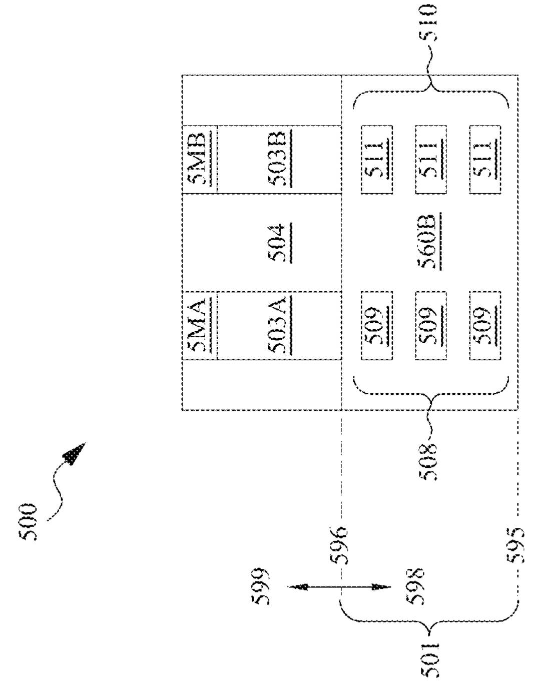

In FIG. 5B, the distal end of dummy contacts 503A and 503B has been recessed and a hardmask situated thereon. Hardmask 5MA is at the distal end of dummy contact 503A, and hardmask 5MB is at the distal end of dummy contact 503B. As described above for FIG. 4B, hardmask material includes silicon carbide, tungsten carbide, or other etch resistant materials which are resistant to the etch process is used to remove insulating materials or dielectric materials as described above in method 300 and preserve the lateral dimensions of the dummy contact prior to formation of the backside contacts for the integrated circuit. In some embodiments, the entire length of a dummy contact (when the dummy contact is a fin of support material) is covered by the hardmask at the distal end thereof.

Figure 4C:
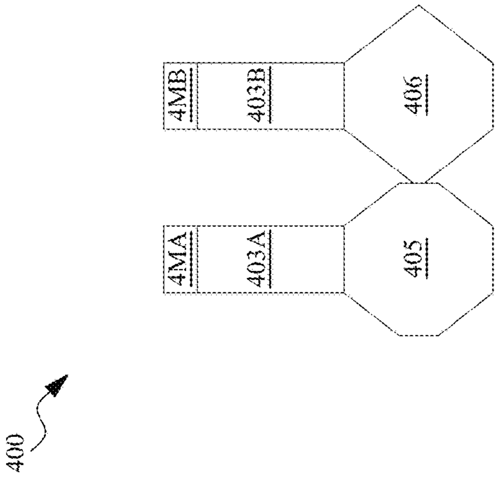
Figure 4D:
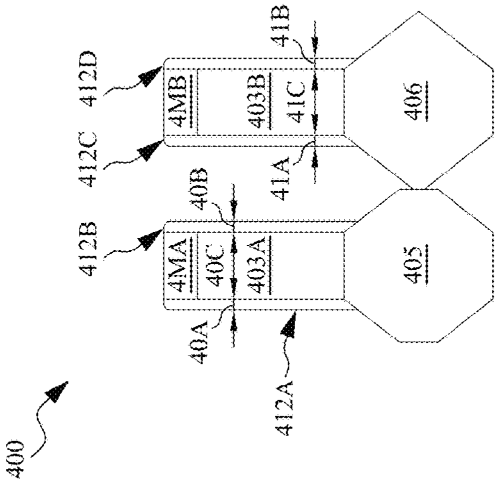
Figure 5C:
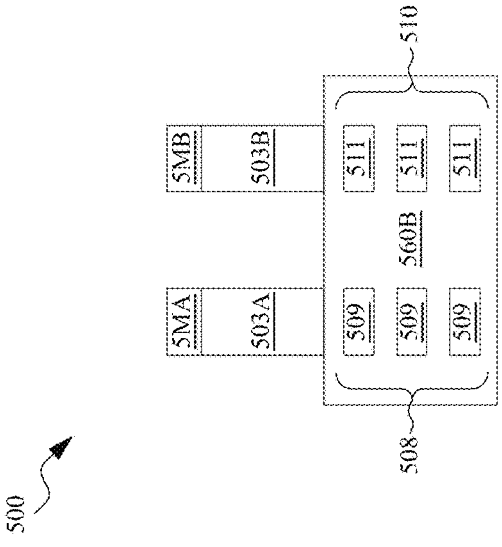
Figure 5D:
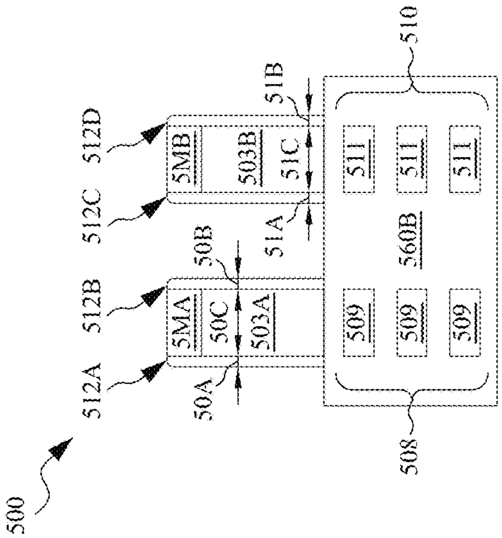
Figure 4E:
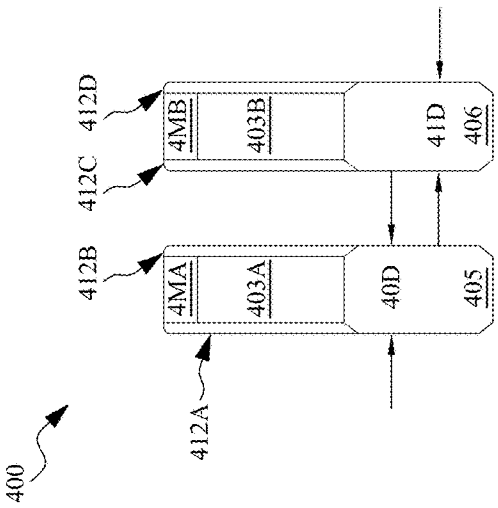
Figure 5E:
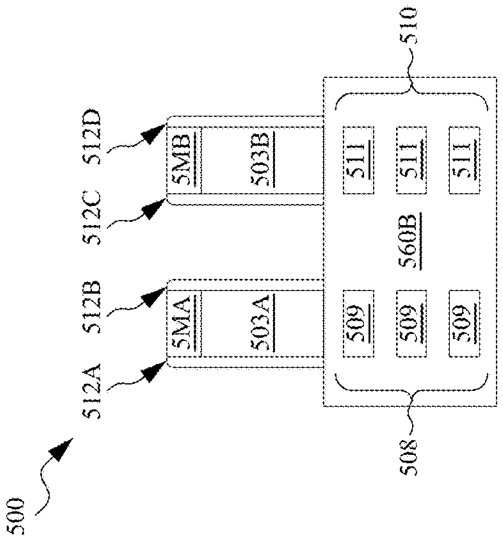

Method 300 includes an operation 304, wherein the source and drain regions of the integrated circuit are trimmed, in accordance with some embodiments. FIGS. 4C-4E are cross-sectional views of integrated circuit 400 during a process of trimming the S/D regions in integrated circuit 400, according to some embodiments. FIGS. 5C-5E are cross-sectional views of an integrated circuit 500 during a process to trim the sides of S/D regions such as S/D regions 405 and 406 in integrated circuit, according to some embodiments.

Trimming the source and drain regions of an integrated circuit involves steps of [1] removing the dielectric layer between the dummy contacts/support material on the backside of the integrated circuit, [2] depositing a spacer material over the dummy contacts and the hardmasks on the distal ends thereof, [3] etching the spacer material to remove portions extending in directions about perpendicular (e.g., not parallel with) to the dummy contact sidewalls, and [4] performing an etch process to trim the S/D regions in the active layer.

In some embodiments, the dielectric material (see dielectric materials 404 and 504) is removed by a wet or aqueous etch process to selectively remove the dielectric layer without eroding the dummy contacts, the hardmasks, the S/D regions, and the gate electrode). In some embodiments, the dielectric layer is removed by a dilute hydrofluoric acid/sulfuric acid solution applied to the backside of the wafer. In some embodiments, the a dilute hydrofluoric acid/sulfuric acid ($HF/H_2SO_4$) mixture removes dielectric the dielectric material between the dummy contacts with selectivity because the dummy contacts (or, the support material) are a semiconductor material. A semiconductor support material is also beneficial during operation 303, wherein the S/D regions are grown at the proximal ends of the dummy contacts because a semiconductor material will have a lattice constant which more closely matches the lattice constant of the S/D region material being grown at the proximal ends of the dummy contacts. Removing the dielectric material on the sides of the dummy contacts prepares the backside for deposition of a spacer layer on the dummy contact sides.

Operation 304 includes steps associated with forming a spacer on the sides of the dummy contacts. By regulating the thickness of the spacer, the width of the S/D regions is adjusted during the trim process, providing additional control over the performance of the integrated circuit. A conformal layer of spacer material is deposited over the tops and sides of the dummy contacts (including the hardmasks). A thickness of the conformal layer of spacer material is regulated by the amount of deposition time allocated for the deposition. In some embodiments, the thickness of the conformal layer of spacer material is further adjusted by performing a thinning process using a wet etch chemistry configured to remove some, but not all, of the spacer material. In some embodiments, the conformal layer of spacer material is a layer of silicon nitride or other spacer material compatible with performance of method 300. After deposition of the spacer material, a first anisotropic etch process is performed in order to remove the portions of the spacer material perpendicular to the dummy contact sidewall. The first anisotropic etch removes the portions of the spacer material at the distal ends of the dummy contacts for both the S/D regions and the gate electrode/channel regions, and the portions of the spacer material against the gate electrode (see FIG. 5D, below) and between the S/D regions of the integrated circuit (see FIG. 4D, below). After the first anisotropic etch, the portions of the spacer material on the sidewalls of the dummy contacts (see spacers 412A-412D and spacers 512A-512D) remains.

The S/D regions are trimmed by performing a second anisotropic etch process which is selective to the gate electrode material, the hardmask material, and the spacer material, which removes the material of the S/D regions. The etch process reduces the width of the S/D regions to about the width of the dummy contact plus the twice the thickness of the spacer material on the sidewalls of the dummy contacts (see FIGS. 4D, 5D, below) because the S/D regions are aligned with sidewalls of the spacer material. In some embodiments, the gate electrode material is recessed by the S/D trim etch without impacting the performance of the integrated circuit.

According to some embodiments, the manufacturing process of an integrated circuit uses the downstream measurement of the width of the S/D regions and/or the thickness of the spacer material on the dummy contacts as dynamic processing parameter. Feedback from downstream measurements of S/D width, or spacer material thickness, provides an additional metric for regulating a manufacturing process to achieve a device structure and performance characteristics within an integrated circuit device specification.

FIGS. 4C-4E are cross-sectional views of integrated circuit 400, and FIGS. 5C-5E are cross-sectional views of integrated circuit 500, during a manufacturing operation analogous to operation 304, described above.

In FIG. 4C the dielectric material 404 has been removed to expose the sides of the dummy contacts and the sides of the hardmasks at the distal ends of the dummy contacts. In FIG. 4C, the S/D regions 405 and 406 are exposed by removal of the dielectric material 404.

In FIG. 5C, the dielectric material 504 has been removed to expose the bottom of gate electrode 560B and to expose the sides of the dummy contacts and the sides of the hardmasks 5MA and 5MB at the distal ends of the dummy contacts.

In FIG. 4D and in FIG. 5D, spacers have been deposited on the sides of dummy contacts 403A and 403B, and on the sides and end of hardmasks 4MA and 4MB. Thus, in FIG. 4D, a spacer 412A and a spacer 412B are on the sides of dummy contact 403A and hardmask 4MA, and a spacer 412C and a spacer 412D are on the sides of dummy contact 403B and hardmask 4MB. On each dummy contact, the spacers extend from the hardmask down to the S/D regions.

In FIG. 4D, dummy contact 403A has a first width 40C and dummy contact 403B has a second width 41C. According to some embodiments, first width 40C and second width 41C are a same width. According to some embodiments, the first width 40C and second width 41C are different widths. Spacer 412A has a thickness 40A, spacer 412B has a thickness 40B, spacer 412C has a thickness 41A, and spacer 412D has a thickness 41B.

In FIG. 4E, S/D region 405 has been trimmed and has sidewalls vertically aligned with the sides of the spacers 412A and 412B, and the S/D region 406 has been trimmed to have sidewalls vertically aligned with the sides of spacers 412C and 412D. Thus, the width of the S/D regions is about the same as the sum of the width of the dummy contact and the thicknesses of the spacers directly above the S/D regions after the trim etch has been performed. Thus, the width of S/D region 405 (first width 40D), is about the width of the dummy contact (width 40C) plus the thickness of the spacer 412A and the spacer 412B (thicknesses 40A and 40B):

$$40D \approx 40C + 40B + 40A \approx 40C + 2[40A] \quad \text{Equation (1).}$$

Similarly, the width of S/D region 406 (width 41D), is about the width of the dummy contact (second width 41C) plus the thickness of the spacer 412C and the spacer 412D (thicknesses 41A and 41B):

$$41D \approx 410C + 41B + 41A \approx 41C + 2[41A] \quad \text{Equation (2).}$$

In FIG. 5D, spacers 512A-512D extend from the hardmasks 5MA and 5MB to the gate electrode 560B. In some embodiments, the spacers extend along the entire vertical sidewall of the hardmasks. In some embodiments, a distal ends of the hardmask side is exposed because the spacer has been eroded. The dimensions of dummy contacts in FIG. 5D have a same identifying numeral as corresponding dimensions of dummy contacts in FIG. 4D, incremented by 100. Dimensions of spacers in FIG. 5D have a same identifying numeral as dimensions of spacers in FIG. 4D, incremented by 10.

In FIG. 5E, gate electrode 560B is unmodified after the S/D region trim etch process has been performed. In some embodiments, a gate electrode experiences some erosion at areas not protected by dummy contacts or spacers on the sides of dummy contacts. Such gate electrode erosion does not tend to adversely impact the performance of the device provided that the erosion does not extend below the spacers on the sides of the dummy contacts, reducing the amount of gate electrode material between the dummy contact and the channels.

Method 300 includes an optional operation 306, wherein the channel regions of the integrated circuit are isolated from each other, in accordance with some embodiments. FIGS. 4F-4J and FIGS. 5F-5J are cross-sectional views of an integrated circuit during performance of optional operation 306. Isolating the channel regions of the integrated circuit from each other includes the following steps: [1] depositing a first dielectric material (see first dielectric material 414) over/between the trimmed S/D region formed in operation 304, [2] recessing first dielectric material to expose the dummy contacts, spacers, and the hardmasks on the dummy contacts, and the gate electrode to be etched (see gate electrode 560B), [3] selectively etching the gate electrode material between channel regions of the integrated circuit to form separate gate electrodes (see gate electrodes 560B1 and 560B2), [4] filling the opening between the adjacent (e.g., newly divided) gate electrodes with a second dielectric material (see second dielectric material 515), and [5] recessing the second dielectric material to expose the gate electrode and the protective layer between the S/D regions of the integrated circuit.

Depositing the first dielectric material includes steps related to the CVD deposition of dielectric materials described above. In some embodiments, the first dielectric material is a layer of silicon dioxide, spin on glass, FSG (fluorosilicate glass), BPSG (borophosphosilicate glass), or some other dielectric material compatible with the method 300.

Recessing the first dielectric material to expose the dummy contacts, spacers, and the hardmasks on the dummy contacts, and to exposed the gate electrode which is to be etched, includes operations related to selective etchback of dielectric materials described above. In some embodiments, the first dielectric material is removed by a selective wet or aqueous etch process. In some embodiments, a dilute hydrofluoric acid/sulfuric acid ($HF/H_2SO_4$) mixture is used to remove the first dielectric material, leaving the spacers on the sides of the dummy contacts, and the hardmasks at the distal ends of the dummy contacts, intact. Recessing the first dielectric material proceeds until the gate electrode in the channel region has been exposed, without exposing the S/D regions of the integrated circuit (see FIGS. 4G, 5G, below).

Etching the gate electrode material includes steps associated with depositing a layer of patterning material on the backside of the wafer, transferring a pattern to the layer of patterning material, etching the gate electrode material through the opening formed in the layer of patterning material, and removing the layer of patterning material from the backside of the integrated circuit. Etching the gate electrode material includes an anisotropic etch which is selective to the gate electrode material, and wherein the layer of patterning material protects the other backside features during the anisotropic etch process. The anisotropic etch of the gate electrode material divides a gate electrode material into smaller portions, each portion having channels therein, and being configured to independently connect to the backside interconnect structure once completed.

Filling the opening between the smaller portions of the gate electrode material with a second dielectric material includes steps related to depositing dielectric material as described above. In some embodiments, the second dielectric material is deposited by epitaxial deposition. In some embodiments, the second dielectric material is deposited by atomic layer deposition. In some embodiments, the second dielectric material is deposited by chemical vapor deposition. In some embodiments, the second dielectric material is silicon dioxide, spin on glass, FSG (fluorosilicate glass), BPSG (borophosphosilicate glass), and the like.

Recessing the second dielectric material includes performing an etch or recess process similar to the recess process performed on the first layer of dielectric material. However, the recessing of the second dielectric layer includes a stronger etchant to remove not only the second dielectric material below the gate electrode (e.g., beyond the bottom of the gate electrode/dummy contact interface), but also the spacer material on the sides of the dummy contacts. The S/D regions of the integrated circuit remain covered by the second dielectric material after performing optional operation 306. When optional operation 306 is not performed, the S/D regions of the integrated circuit remain covered by the first dielectric material.

FIGS. 4F-4J and FIGS. 5F-5J are cross-sectional views of an integrated circuit during performance of optional operation 306.

Figure 4F:
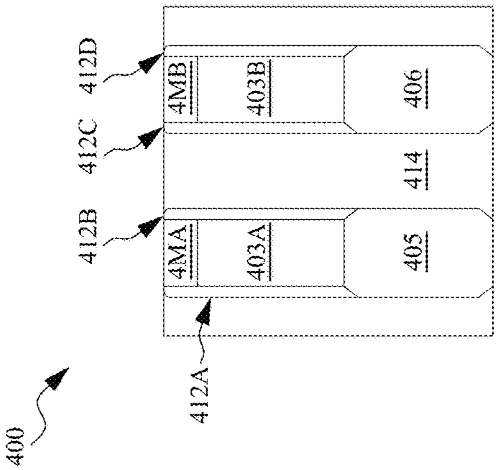

In FIG. 4F first dielectric material 414 is deposited between S/D regions 405 and 406, and between dummy contacts 403A and 403B. First dielectric material 414 has been planarized to expose the distal ends of hardmasks 4MA and 4MB and the ends of the spacers 412A-412D. First dielectric material 414 provides stability or protection and electrical isolation of S/D regions in integrated circuit 400.

Figure 5F:
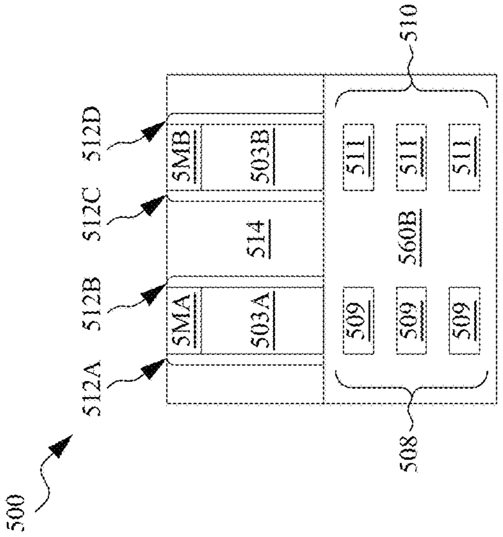

In FIG. 5F, first dielectric material 514 is deposited between dummy contacts 403A and 403B. First dielectric material 414 has been planarized to expose the distal ends of hardmasks and 5MB the ends of the spacers 412A-412D.

Figure 4G:
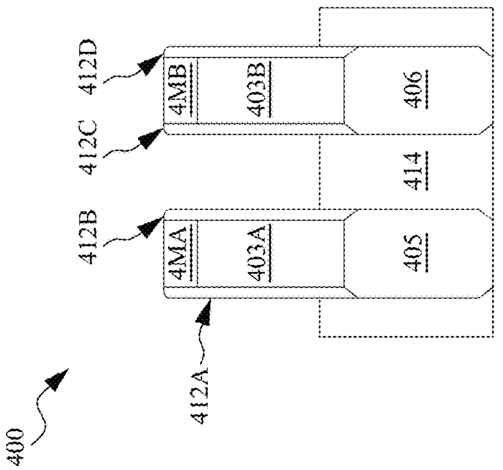

In FIG. 4G, the first dielectric material 414 has been recessed to expose the spacers 412A-412D on the sides of the dummy contacts. The S/D regions 405 and 406 remain covered by the first dielectric material.

Figure 5G:
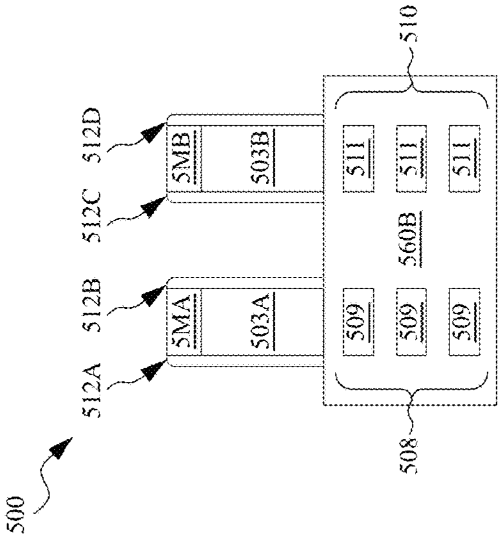

In FIG. 5G, first dielectric material 514 is completely removed from the sides of the spacers 512A-512D, exposing gate electrode material 560.

Figure 4H:
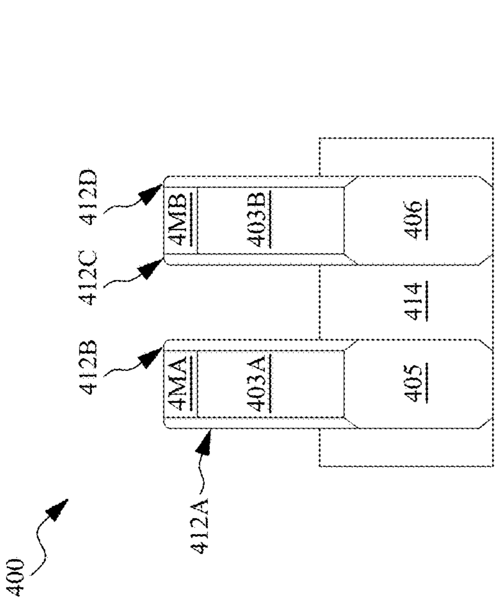

In FIG. 4H, the cross-sectional view of integrated circuit 400 remains unchanged as compared to the cross-sectional view in FIG. 4G.

Figure 5H:
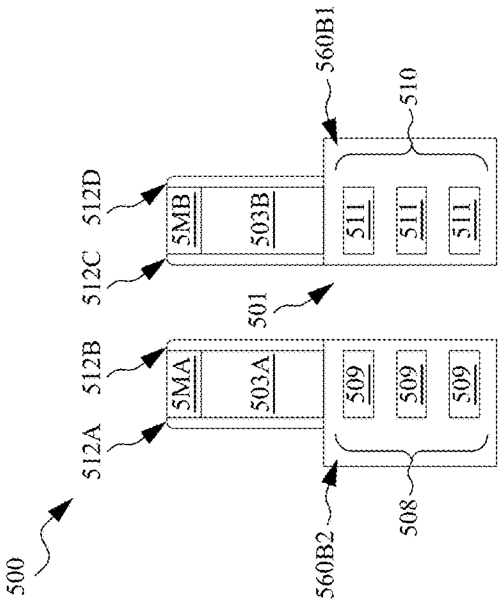

In FIG. 5H, an opening 501 has been etched between the channel region 508 and the channel region 510, making two gate electrodes: gate electrode 560B2 against dummy contact 503A, and gate electrode 560B1 against dummy contact 503B. The sidewall of the channel region 508 aligns with a sidewall of spacer 512B, and a sidewall of the channel region 510 aligns with the sidewall of spacer 512C.

Figure 4I:
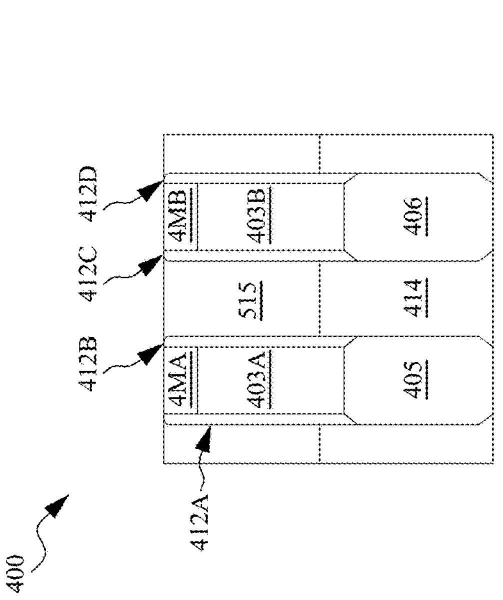
Figure 4K:
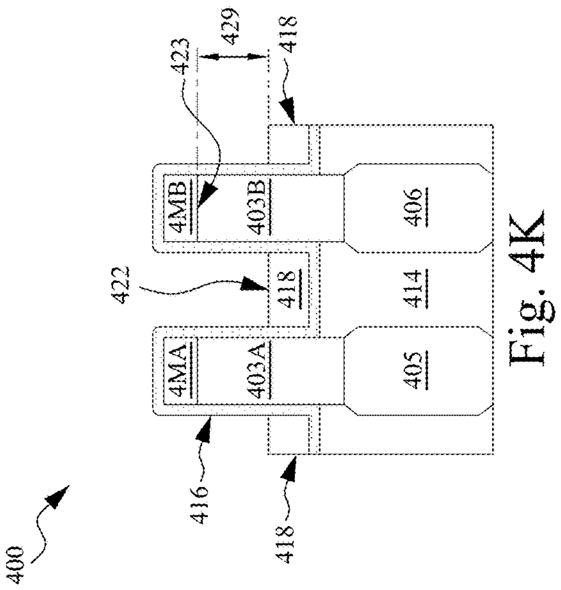

FIG. 4I is a cross-sectional view of integrated circuit 400 after deposition of a second dielectric material 515 over the first dielectric material 414, spacers 412A-412D, and hardmasks 4MA-4MB. In FIG. 4I, the second dielectric material 515 has been planarized and the distal ends of hardmasks 4Ma and 4MB are exposed.

Figure 5I:
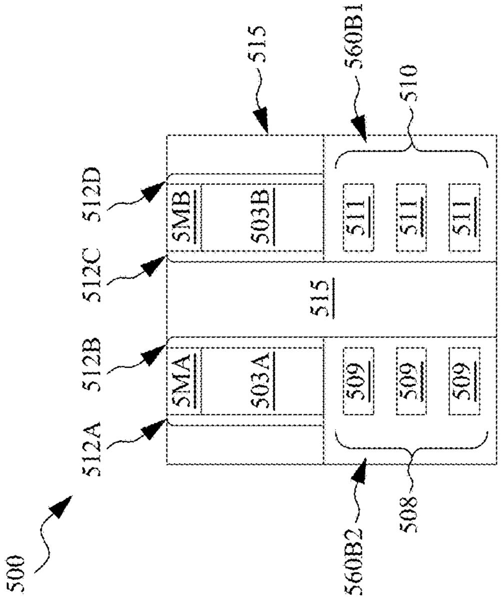
Figure 5K:
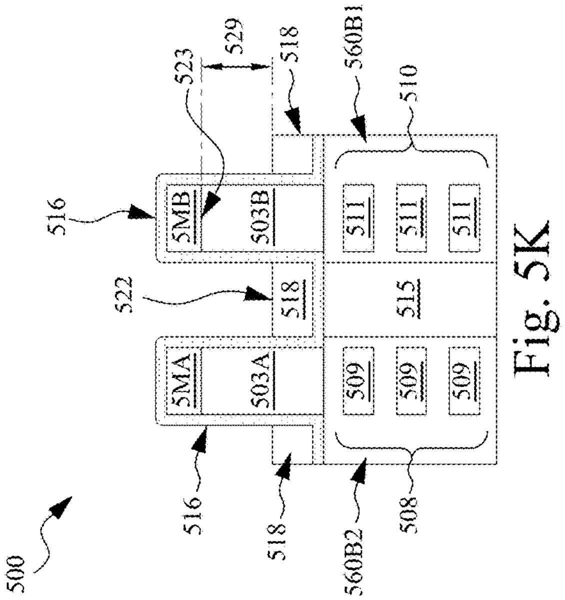

FIG. 5I is a cross-sectional view of integrated circuit 500 after deposition of second dielectric material 515 between channel regions 508 and 510, and over gate electrodes 560B1 and 560B2, spacers 512A-512D, and hardmasks 5MA and 5MB. In FIG. 5I, the second dielectric material 515 has been planarized to expose the distal ends of hardmasks 5MA and 5MB.

Figure 4J:
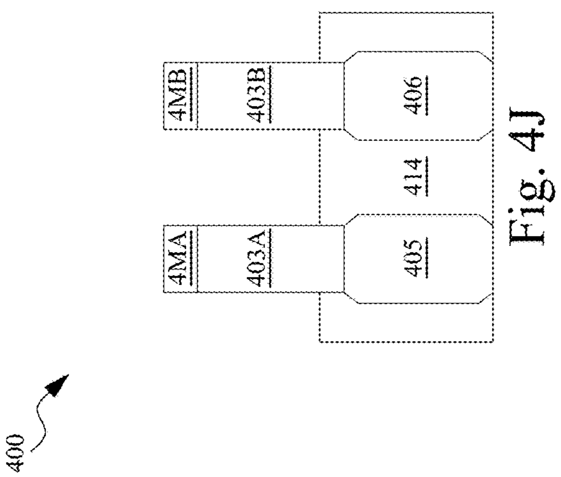

In FIG. 4J, integrated circuit 400 the spacers 412A-412D have been removed from the sides of the dummy contacts 403A and 403B and from the sides of hardmasks 4MA and 4MB and the surface of first dielectric material 414.

Figure 5J:
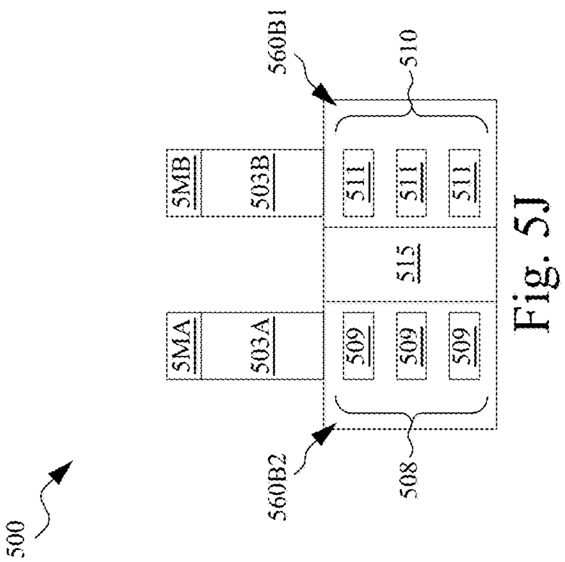

In FIG. 5J, spacers 512A-512D have been removed from the sides of the dummy contacts 503A and 503B and from the sides of hardmasks 5MA and 5MB, exposing gate electrodes 560B1 and 560B2.

Method 300 includes an operation 308, wherein an insulating mask is formed on the backside of the integrated circuit, in accordance with some embodiments. FIGS. 4K and 5K are cross-sectional views of embodiments of an integrated circuit wherein an insulating mask is formed over the dummy contacts and the backside of the integrated circuit. Steps of operation 308 include [1] depositing a conformal insulating layer (see, e.g., conformal insulating layer 416 and conformal insulating layer 516) against first dielectric material, the gate electrodes, the second dielectric material, the sides of the dummy contacts, and over the hardmasks, [2] depositing an insulating material (see insulating material 418, 518) over the conformal insulating layer, and [3] recessing the insulating material by an etch process to expose the distal portions of the conformal insulating layer over the dummy contacts.

Depositing a conformal insulating layer includes steps similar to steps given above for depositing spacer material on the dummy contacts and hardmasks. In some embodiments, the conformal insulating layer is a spacer material such as silicon nitride any other spacer material compatible with method 300. Spacer material is deposited by a chemical vapor deposition (CVD) process such as plasma enhanced CVD (PECVD), low pressure CVD (LPCVD), or the like, or any other process for depositing conformal layers on the first dielectric material, gate electrode material, and second dielectric material. In some embodiments, the insulating material deposited over the conformal insulating layer is one of silicon dioxide, BPSG, spin-on-glass, a low-k dielectric material, or some other dielectric material compatible with selective etchback without damaging or penetrating the conformal insulating material over the dummy contacts and the hardmask (when a hardmask is present at the bottom of the dummy contact). In some embodiments, insulating material is deposited by CVD, a spin-on or reflow process, or some other deposition process compatible with method 300. The conformal insulating layer remains in the integrated circuit, and undergoes minor adjustments (forming openings, trimming from off the hardmasks) during operations of the method 300.

Depositing insulating material over the conformal insulating material include steps associated with atomic layer deposition, chemical vapor deposition (CVD), or other deposition techniques compatible with depositing dielectric materials on the backside of the integrated circuit. In some embodiments, the insulating material is deposited thickly, to cover the ends of the dummy contacts and the conformal insulating material deposited thereon, and the insulating material is thinned or recessed to expose the distal ends (and a significant portion of the sidewalls) of the dummy contacts (or, in some embodiments, the fins of substrate material).

In some embodiments, recessing the insulating material includes performing a liquid or aqueous etch process wherein the etchant is selective to the insulating material, and removes the conformal insulating layer at a much slower rate. In some embodiments, recessing the insulating material includes performing a plasma etch process which is selective to the insulating material over the conformal insulating layer. In some embodiments, aqueous solutions for recessing the insulating material include dilute hydrofluoric acid, dilute sulfuric acid, hydrochloric acid, or other acids or etchants blended in such a way as to have a higher etch rate of the insulating material than of the conformal insulating layer.

In FIG. 4K and FIG. 5K, the conformal insulating layer has been deposited and the first insulating material has been deposited and recessed to expose the distal portions of the dummy contacts, covered by the conformal insulating layer. The conformal insulating layer on the sides of the dummy contacts, and against the active layer 101, remains in the final integrated circuit to electrically isolate backside electrodes and conductive material from backside contacts and power rails. The conformal insulating layer and the first insulating material comprise the insulating mask against the bottom of the active area.

FIGS. 4K-5K are cross-sectional views of integrated circuit 400 and integrated circuit 500 during performance of operation 308.

In FIG. 4K, a conformal insulating layer 416 is on the exposed surface of first dielectric material 414, on the sides of dummy contacts of 403A and 403B, and on the sides and end of hardmasks 4MA and 4MB. Insulating material 118 has been deposited on the exposed surface of conformal insulating layer 416, and recessed to expose the distal portions of the dummy contacts 403A and 403B, and to expose the conformal insulating layer 416. An exposed surface of insulating material 418 is an offset distance 429 from an interface between the distal end of a dummy contact 403B and the hardmask 4MB.

In FIG. 5K, conformal insulating layer 516 is on the exposed surface of the gate electrodes 560B1 and 560B2, and on the second dielectric material 515 between channel regions 508 and 510. Insulating material 518 has been deposited the exposed surface of conformal insulating layer 516, and recessed to expose the distal portions of the dummy contacts 503A-503B. An exposed surface of insulating material 518 is an offset distance 529 from an interface between the distal end of a dummy contact 503B and the hardmask 5MB.

Method 300 includes an operation 310, wherein openings are formed through the insulating mask. As is described above for operation 308, the insulating mask includes at least a conformal insulating layer and first insulating material deposited thereon. Operation 310 includes steps associated with [1] generating a patterned mask layer over the insulating mask layer, and [2] removing a portion of the insulating mask layer. In some embodiments, the opening through the insulating mask layer exposes the hardmask and dummy contact beneath the conformal insulating layer exposed within the opening in the patterned mask layer (see FIGS. 4L and 5L, below). In some embodiments, the opening through the insulating mask layer exposes the gate electrode (see FIG. 5T, below).

A pattern of openings in the conformal insulating layer corresponds to a pattern of backside contacts to S/D regions of the integrated circuit (where one drain region connects to another drain region) or a pattern of backside contacts to a gate electrode/channel region of the integrated circuit. In some embodiments, the pattern of openings in the conformal insulating layer corresponds to all of the source/drain regions of an integrated circuit. In some embodiments, part of the source/drain regions of the integrated circuit have corresponding openings in the conformal insulating layer, and part of the source/drain regions of the integrated circuit do not have corresponding openings in the conformal insulating layer. The pattern of openings in the conformal insulating layer is related to the layout of the topside interconnect structure of the integrated circuit in order provide each S/D region, and each gate electrode, with an electrical connection, whether on the backside or the topside.

A layer of patterning material is deposited over the insulating mask, and a pattern is generated in the layer of patterning material to expose portions of the conformal insulating layer over a dummy contact in the integrated circuit. In some embodiments, the pattern opening exposes conformal insulating material between dummy contacts and adjacent to a gate electrode (see FIG. 5T, patterning material 540). According to some embodiments, the layer of patterning material is a layer of photoresist, and the pattern is generated in the layer of photoresist by exposing the photoresist and developing the photoresist to remove portions of the layer. In some embodiments, the layer of patterning material is compatible with ultraviolet or electron beam lithography and the pattern is generated using techniques known in the art which are compatible with materials responsive to ultraviolet and electron beam pattern transfer.

Figure 5L:
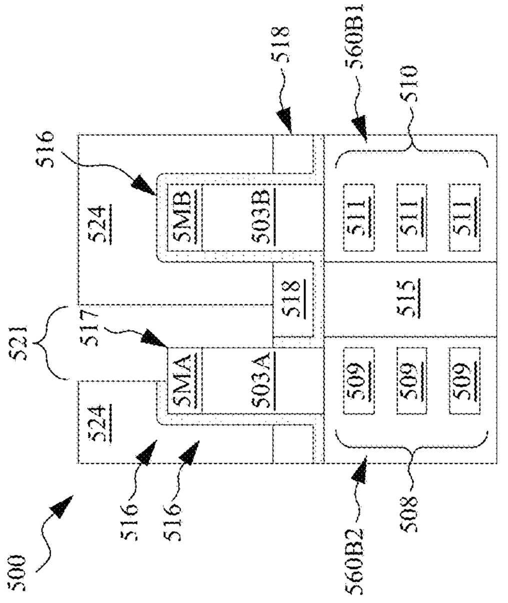
Figure 5M:
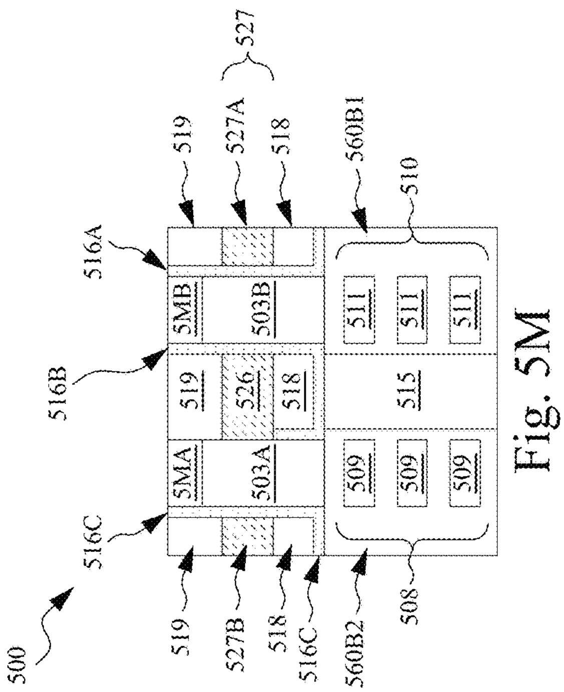
Figure 5N:
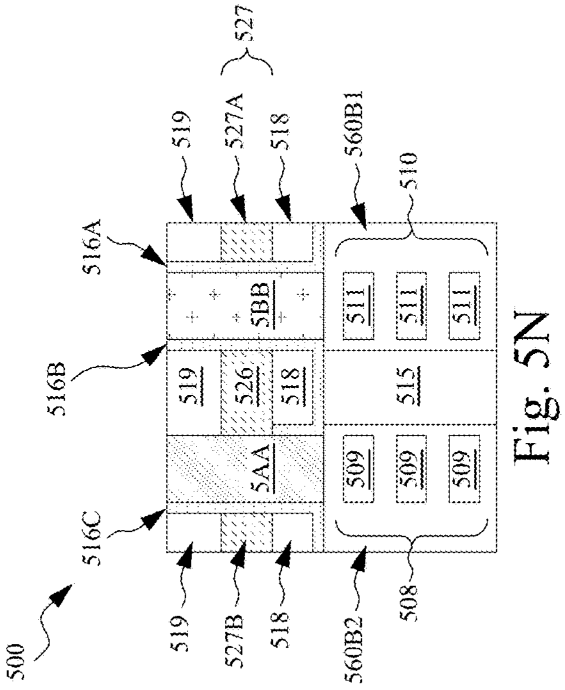
Figure 5O:
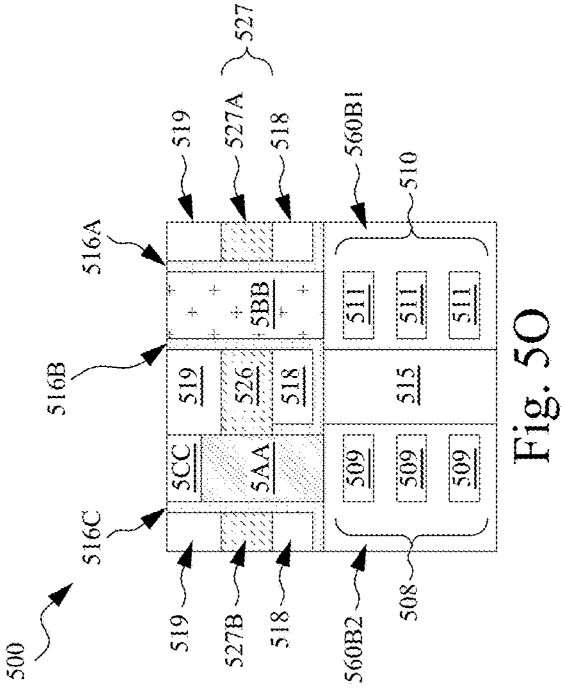
Figure 5P:
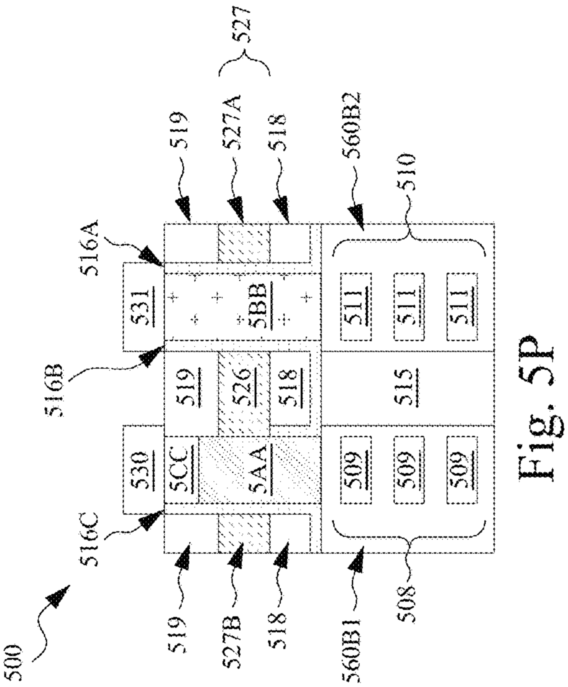
Figure 5Q:
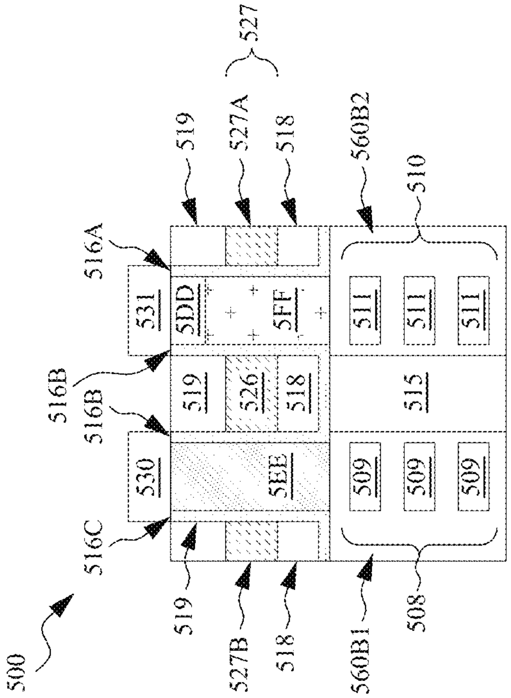
Figure 5R:
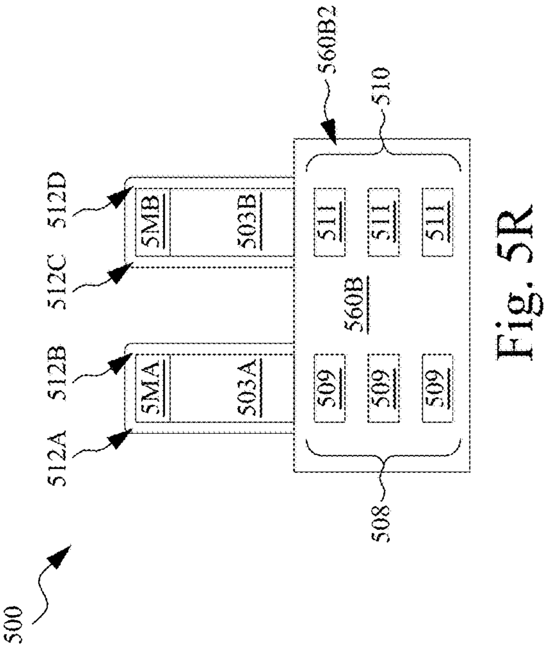
Figure 5S:
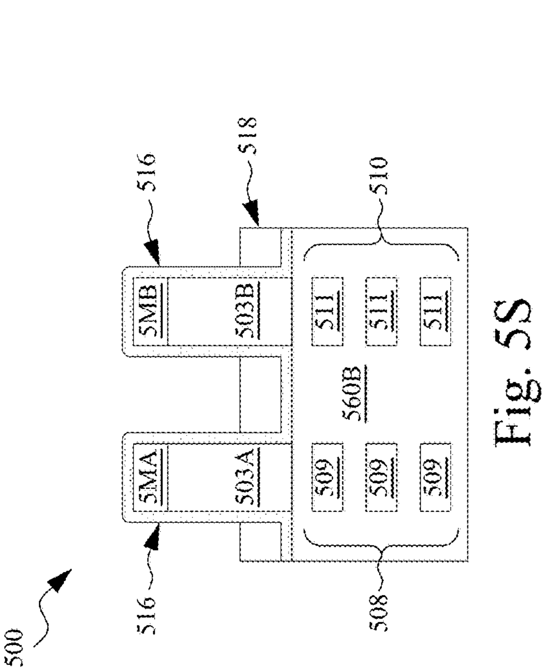
Figure 5T:
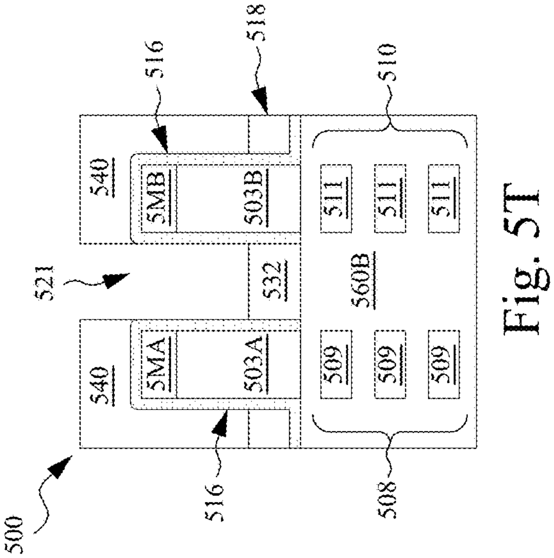
Figure 5U:
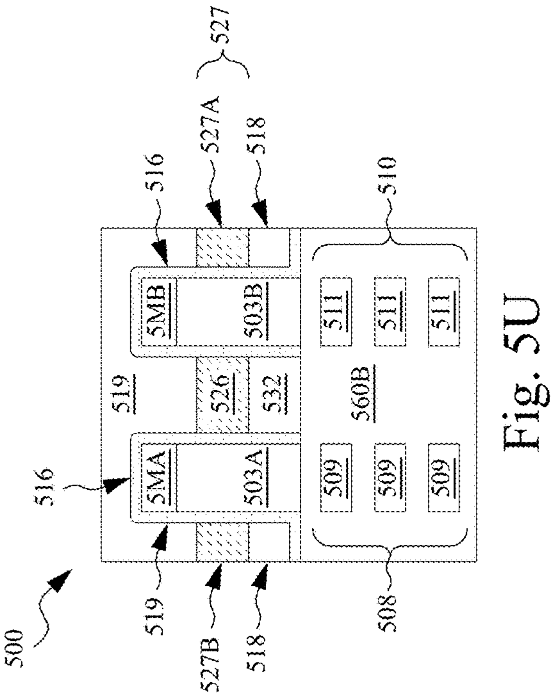

In some embodiments, the process of removing a portion of the insulating mask layer includes performing a plasma etch process in order to expose the support for the insulating mask layer (e.g., the dummy contact and hardmask within the opening, as in FIG. 5L, or the gate electrode material within the opening, as in FIG. 5T). According to some embodiments, the process of removing a portion of the insulating mask layer includes performing a wet etch process wherein the etchant chemistry is selective to the conformal insulating layer and has a low removal rate for the material of the support. In some embodiments, a plasma etch process is used to open the insulating mask layer. According to some embodiments, performing a wet etch process to selectively open the conformal insulating layer has a lower likelihood of damaging the gate electrode material than a plasma etch process ion bombardment has a tendency to disrupt the gate electrode material surface and lead to erosion. Further, some wet etch processes have a greater degree of selectivity when removing materials as compared to plasma etching. In some embodiments, the overall etch rate of the isolation mask material is regulated by varying the temperature and concentration of etchants of the etch solution. Operation 310 also includes steps associated with removing the layer of patterning material from over the insulating mask in order to expose the insulating mask around the openings.

Figure 4L:
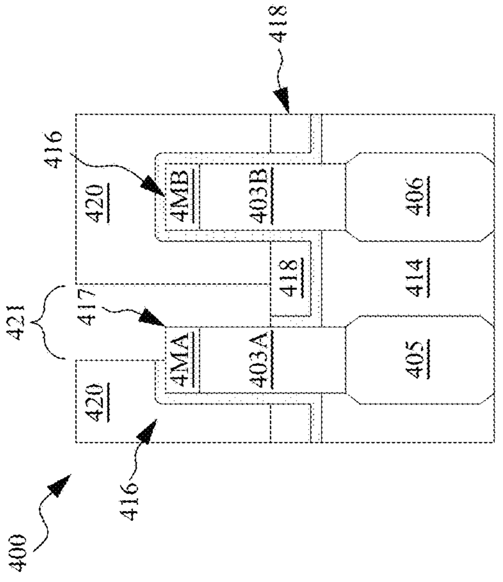

In FIG. 4L, a layer of patterning material 420 is deposited over conformal insulating layer 416 and the insulating material 418. An opening 421 has been formed in the layer of patterning material 420, and the conformal insulating layer 416 has been etched to form an opening 417 in which hardmask 4MA and dummy contact 403A are exposed. The opening for a backside interconnect does not span the entire length of the dummy contact, but the portion of the dummy contact adjacent to a single S/D region or a single gate electrode.

In FIG. 5L, a layer of patterning material 520 has been deposited over conformal insulating layer 516 and the insulating material 518. An opening 521 has been formed in the layer of patterning material 520, and the conformal insulating layer 516 has been etched to form an opening 517 through which hardmask 5MA and dummy contact 503A are exposed.

Figure 4M:
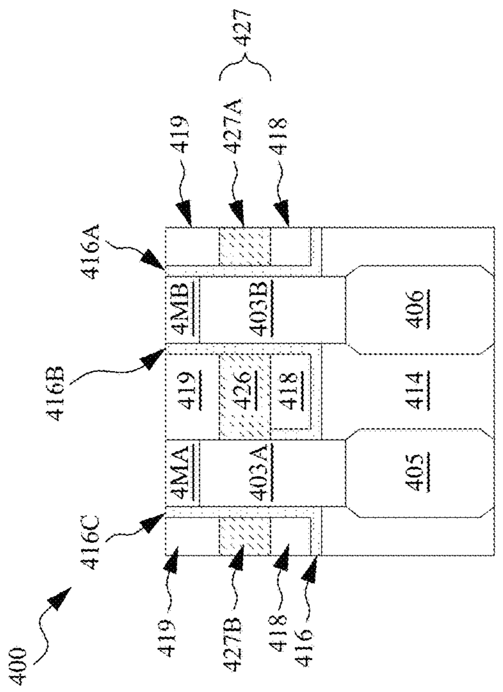

Method 300 includes an operation 312, wherein a conductive material is deposited over the insulating mask and in the openings of the insulating mask, in accordance with some embodiments. In some embodiments, the conductive material is deposited directly against the insulating mask on the backside of the integrate circuit (see FIGS. 4M, 5M, and 5Q). In FIG. 4M and FIG. 5M, conductive material is deposited over the insulating mask and in openings of the insulating mask generated during operation 310. According to some embodiments, depositing the conductive material over the insulating mask includes sputtering processes and/ or electrodeposition of metallic materials. In some embodiments, depositing the conductive material includes depositing a seed layer to promote electrodeposition with uniform coverage and reduced defects. According to some embodiments, the conductive material includes tungsten, cobalt, titanium, platinum, palladium, tantalum, aluminum, and alloys thereof, or other materials compatible with deposition into the space between dummy contacts without generating voids.

In some embodiments, depositing the conductive material over the insulating mask and in the openings of the insulating mask includes a further step of recessing the conductive material to have a vertical dimension which is smaller than the vertical dimension of the dummy contact extending away from the insulating material. In some embodiments, operation 312 includes a step of depositing a second layer of insulating material on the conductive material (after recessing to have the smaller vertical dimension as described above). The second layer of insulating material electrically isolates or encapsulates the conductive material between two layers of insulating material to prevent corrosion and short circuits to the backside interconnection being formed. In some embodiments, after depositing the second layer of insulating material, the integrated circuit is planarized using a chemical mechanical polishing step to produce a flat surface for subsequent operations. The planarizing step removes the conformal insulating layer the end of the hardmask to expose the hardmask and any remaining support material (see first active area 162A in FIG. 2, between S/D regions and between backside contacts 1BB and 2BB) for subsequent operations.

In FIG. 4M, a conductive material layer 427 has been deposited on top of the insulating material 418. Conductive material layer includes backside interconnect 426 between dummy contact 403A and dummy contact 403B, conductive material 427B on the opposite side of dummy contact 403A from backside interconnect 426, and conductive material 427A on the opposite side of dummy contact 403B from backside interconnect 426. Backside interconnect 426 is directly against dummy contact 403A. In some embodiments, the backside interconnect 426 is against less than the entire side of the dummy contact 403A exposed within the opening 417. In some embodiments, backside interconnect 426 is directly against an entirety of the side of dummy contact 403A exposed within the opening 417. In some embodiments, the backside interconnect is against the entire side of the dummy contact 403A and a side of the hardmask 4MA, as well. A second insulating material 419 has been deposited on the conductive material layer 427, the conformal insulating layer 416.

The second insulating material 419 has been planarized to expose the distal ends of hardmasks 4MA-4MB, dividing the conformal insulating layer into portions: conformal insulating layer portion 416A is on a first side of dummy contact 403B (against conductive material 427B), a conformal insulating layer portion 416B is on a second side of the dummy contact 403B and against backside interconnect 426. Conformal insulating layer portion 416B extends from dummy contact 403B, below insulating material 418 to the first side dummy contact 403A. The conformal insulating layer portion 416C is on the second side of dummy contact 403A and against conductive material 527B and extends below insulating material 518 against first dielectric material 414.

In FIG. 5M, structures having a similar function and description is elements of FIG. 4M have a same identifying numeral, incremented by 100. In FIG. 5M, hardmasks 5MA and 5MB have been exposed after the second insulating material 519 has been planarized. Conductive material layer includes backside interconnect 526 between dummy contact 503A and dummy contact 503B, conductive material 527B on the opposite side of dummy contact 503A from backside interconnect 526, and conductive material 527A on the opposite side of dummy contact 503B from backside interconnect 526. Backside interconnect 526 is directly against dummy contact 503A. In some embodiments, the backside interconnect 526 is against less than the entire side of the dummy contact 503A exposed within the opening 517. In some embodiments, backside interconnect 526 is directly against an entirety of the side of dummy contact 503A exposed within the opening 517. In some embodiments, the backside interconnect is against the entire side of the dummy contact 503A and a side of the hardmask 505A, as well. A second insulating material 519 has been deposited on the conductive material layer 527, the conformal insulating layer 516.

The second insulating material 519 has been planarized to expose the distal ends of hardmasks 505A-505B, dividing the conformal insulating layer into portions: conformal insulating layer portion 516A is on a first side of dummy contact 503B (against conductive material 527B), a conformal insulating layer portion 516B is on a second side of the dummy contact 503B and against backside interconnect 526. Conformal insulating layer portion 516B extends from dummy contact 503B, below insulating material 518 to the first side dummy contact 503A. The conformal insulating layer portion 516C is on the second side of dummy contact 503A and against conductive material 527B and extends below insulating material 518 against gate electrode 560B2.

Method 300 includes an operation 311, wherein a conductive material is deposited against the gate electrode and in the opening through the insulating mask. In embodiments of method 300, operation 308, where an opening through the insulating mask is formed between dummy contacts, and exposes the gate electrode, a conductive barrier layer is deposited against the gate electrode to transfer a signal from the backside interconnect to the gate electrode and active one or more channels in the gate electrode. According to some embodiments, the conductive barrier layer comprises epitaxially grown semiconductor material such as silicon, silicon germanium, or other semiconductor materials used in the art. In some embodiments, a conductive liner is deposited in the opening and against the gate electrode to hamper diffusion of the conductive barrier layer material into the gate electrode. In some embodiments, the conductive barrier layer is a conductive liner material (e.g., a metal nitride), which hampers diffusion of the conductive material of the backside interconnect into the gate electrode.

FIG. 5T is a cross sectional view of an integrated circuit 500, after performing operation 311, according to some embodiments. In FIG. 5T, a layer of patterning material 540 has been deposited over the insulating mask (conformal insulating layer 516 and insulating material 518) and an opening 521 formed therein between dummy contacts 503A and 503B. Insulating material 518 and conformal insulating layer 516 have been removed from against gate electrode 560B within opening 521, and a conductive barrier layer 532 has been deposited between the dummy contacts 503A and 503B and directly against the gate electrode 560B. In some embodiments, the conductive barrier layer is a backside gate electrode contact electrically connected to the gate electrode 560B of the integrated circuit. According to some embodiments, the conductive barrier layer 532 comprises epitaxially grown semiconductor material such as silicon, silicon germanium, or other semiconductor materials used in the art. The conductive barrier layer protects the gate electrode 560B from contamination by diffusion of metal in an interconnect formed against a bottom side of the conductive barrier layer 532. In some embodiments, the conductive barrier layer is a deposited metal layer such as silicon, tungsten, titanium, cobalt, nickel, platinum, palladium, and alloys thereof, as well as other metals compatible with the performance of method 300. In some embodiments, the conductive barrier layer is a metal nitride of metals such as silicon, tungsten, titanium, cobalt, nickel, platinum, palladium, and alloys thereof, as well as other metals compatible with the performance of method 300. In some embodiments, a dielectric barrier is deposited against the gate electrode 560B to prevent metals from diffusing into the gate electrode 560B. The dielectric barrier includes nitrides of materials such as silicon, tungsten, titanium, cobalt, nickel, platinum, palladium, and alloys thereof, as well as other nitrides for use against the gate electrode.

Figure 4N:
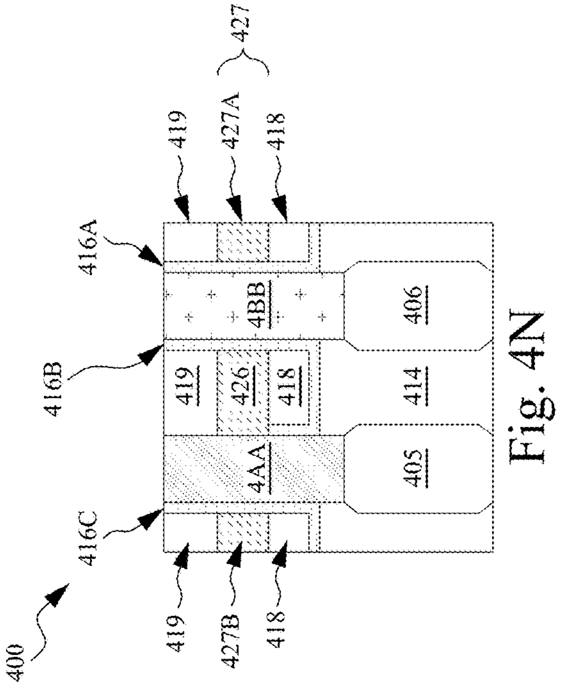
Figure 4O:
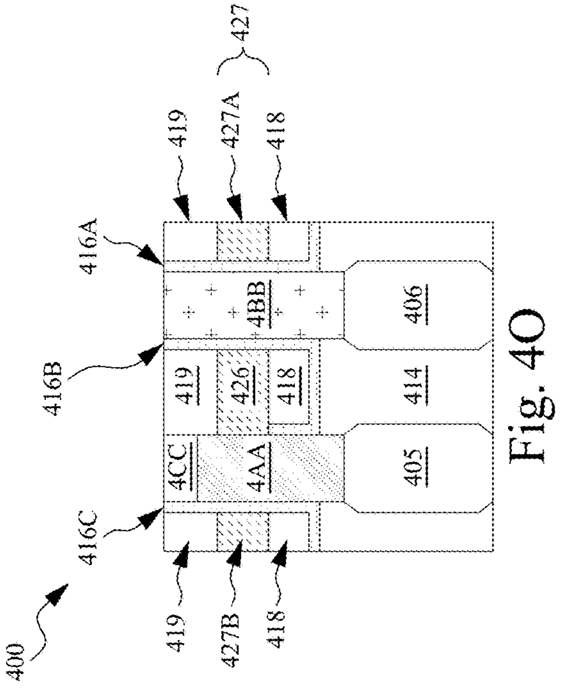
Figure 4P:
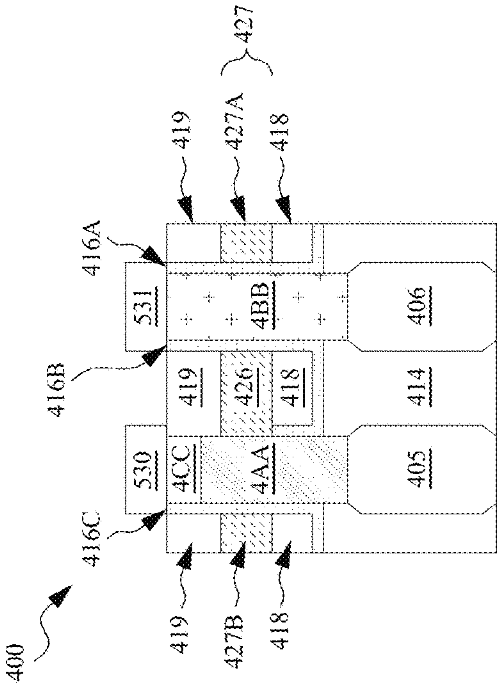

Method 300 includes an operation 314, wherein backside contacts are formed, in accordance with some embodiments. In FIGS. 4N-4O, backside contacts 4AA and 4BB are against the S/D regions of the active layer and backside contact 4AA electrically connects to backside interconnect 426 after performing operation 314. Forming backside contacts includes steps of: [1] depositing a mask layer over the second insulating material, [2] generating a pattern in the mask layer to expose the locations for backside contacts, [3] performing an etch process to remove the dummy contacts (or, exposed portions of the support material) at the exposed locations within the patterned mask layer while leaving unexposed portions of the support material in place, and [4] depositing a conductive contact material in openings formed by the removal of the exposed portion of the support material. After depositing the conductive contact material in the openings, the backside contacts electrically connect elements of the active layer of the integrated circuit to each other. FIGS. 6A-11 are non-limiting examples of backside interconnects in an integrated circuit layout.

Depositing a mask layer and generating a pattern in the mask layer to expose the locations for backside contacts is as described hereinabove, or in the discussion of FIG. 14. The etch process to remove the dummy contacts is an anisotropic plasma etch process, or a selective wet etch process, through the openings in the patterned mask layer, and exposes the bottom of the S/D regions (see S/D region 405 in FIG. 4N) and/or the bottom of the gate electrode in a channel region (see FIG. 5N, channel region 508). Depositing the conductive contact material in the openings is performed by electrochemical plating, sputtering, or some other technique of forming contacts with little or no void formation within the body of the contact.

In some embodiments, the dummy contact, or the support material fin, is left in place during operation 314 because the support material electrically isolates backside contacts from each other in the layer of the backside interconnect structure according to a circuit specification. In some embodiments, the dummy contact is removed in a separate cycle of patterning, etching away the dummy contact, and filling the openings by removing the dummy contact with a dielectric material in order to provide enhanced electrical isolation between backside contacts.

In some embodiments, the manufacture of a backside contact includes a further processing step wherein the distal end of the conductive contact material is removed or modified to seal or isolate the contact from a remainder the integrated circuit including a backside power rail. In FIG. 4O, backside contact 4AA includes is against an isolation plug 4CC.

In FIG. 4N, integrated circuit 400 contains a backside contact 4AA directly connected to backside interconnect 426 and S/D region 405. Backside contact 4BB is electrically connected to S/D region 406, but is electrically isolated from the conductive material layer 427. Dummy contacts on the backside of the integrated circuit have been removed by an etch process to form openings into which a conductive contact material has been deposited. The etch process for removing hardmasks and dummy contacts includes steps associated with [1] masking the backside of the integrated circuit to expose only a portion of the dummy contact for a single device interconnection, [2] performing the etch process to remove the exposed portion of the dummy contact, and [3] removing the mask layer prior to depositing conductive contact material into the opening thus formed.

According to some embodiments, the conductive contact material is a metal such as tungsten, tantalum, titanium, platinum, palladium, nickel, or alloys thereof, or other conductive metals for interconnects adjacent to an active area of the semiconductor device. In some embodiments, the conductive contact material is deposited into the opening by sputtering or electrodeposition.

After deposition of the conductive contact material into the openings, the backside is planarized to expose the second insulating material 419. Second insulating material 419 electrically isolates backside interconnect 426 from direct physical contact with a backside power rail (see FIG. 4P, below).

In FIG. 5N, integrated circuit 500 contains a backside contact 5AA directly connected to backside interconnect 526 and gate electrode 560B2. Backside contact 5BB is electrically connected to S/D region 506 and gate electrode 560B1. Dummy contacts on the backside of the integrated circuit have been removed by an etch process to form openings into which a conductive contact material has been deposited. The etch process for removing hardmasks and dummy contacts includes steps associated with [1] masking the backside of the integrated circuit to expose only a portion of the dummy contact for a single device interconnection, [2] performing the etch process to remove the exposed portion of the dummy contact, and [3] removing the mask layer prior to depositing conductive contact material into the opening thus formed.

According to some embodiments, the conductive contact material is a metal such as tungsten, tantalum, titanium, platinum, palladium, nickel, or alloys thereof, or other conductive metals for interconnects adjacent to an active area of the semiconductor device. In some embodiments, the conductive contact material is deposited into the opening by sputtering or electrodeposition.

After deposition of the conductive contact material into the openings, the backside is planarized to expose the second insulating material 519. Second insulating material 519 electrically isolates backside interconnect 526 from direct physical contact with a backside power rail (see FIG. 5P, below).

FIG. 4O is a cross-sectional diagram of integrated circuit 400 wherein the distal portion of backside contact 4AA has been replaced with an isolation plug 4CC, wherein the isolation plug 4CC prevents current flow between a backside power rail and the backside contact 4AA. An isolation plug comprises a nitride, carbide, or oxide material formed on the distal end of the contact, or some other insulating material formed in the recessed opening. Backside contact 4BB is electrically connected to S/D region 406 and able to make an electrical connection with a backside power rail against second insulating material 419.

In FIG. 5O, the isolation plug 5CC is against a bottom end of the backside contact 5AA and directly against the second insulating material 519 at the bottom of the film stack below the gate electrode 560B2. Backside contact 5AA is directly connected to the backside interconnect 526 and is electrically isolated by isolation plug 5CC from making contact with a backside power rail. Backside contact 5BB is electrically connected to gate electrode 560B1 and configured to electrically connect to a backside power rail.

Method 300 includes an operation 316, wherein a backside power rail is electrically connected to at least one backside contact, in accordance with some embodiments. The backside power rail is formed on the backside of the integrated circuit (e.g. against the second insulating material and/or the distal ends of backside contacts) by depositing a metal layer against the backside of the integrated circuit, forming a patterned mask on the blanket metal layer, and performing an etch process to remove exposed portions of the blanket metal layer. The mask is patterned to have a plurality of lines or pads therein, such that the mask lines corresponds to positions of backside power rails and backside contacts or power transmission vias from the topside of the integrated circuit. Exposed portions of the blanket metal layer are removed by a plasma or wet etch process to expose the second insulating material (see second insulating material 119 in FIG. 4P). The metal layer used to make backside power rails includes tungsten, titanium, platinum, palladium, cobalt, aluminum, or another metal compatible with conductive lines in the region of integrated circuit transistors.

FIGS. 4P and 5P are cross-sectional views of an integrated circuit, in accordance with some embodiments. FIGS. 4P and 5P are views of integrated circuit 400, and integrated circuit 500, after performing operation 316 of method 300, as described above. FIG. 4P is a cross-sectional diagram integrated circuit 400 after deposition of backside power rails 530 and 531 deposited against second insulating material 419 and the isolation plug 4CC. FIG. 5P is a cross-sectional view of integrated circuit 500, wherein isolation plug 5CC is against to backside power rail 530 and backside contact 5AA, and where backside power rail 531 is electrically connected to backside contact 5BB.

FIG. 5Q is a cross-sectional view of integrated circuit 500 at a location having no opening in conformal insulating layer 516. In FIG. 5Q, a backside interconnect 526D is electrically isolated from backside contacts to gate electrodes. Backside contact 5AA is electrically isolated from backside power rail 530 by isolation plug 5CC. Backside contact 5BB is electrically connected to both backside power rail 531 and gate electrode 560B2. In FIG. 5Q, backside interconnect 526 is electrically isolated from contacts 5EE and 5FF by conformal insulating layer 516.

As described above in operation 310, some embodiments of the method 300 include steps associated with forming an opening through the insulating mask layer to expose the gate electrode. FIGS. 5R-5U are cross-sectional views of the integrated circuit 500 during performance of method 300, according to some embodiments. In FIGS. 5R-5U, a single backside interconnect is between dummy contacts 503A and 503B and is configured to electrically activate channels in both channel region 508 and channel region 510. Elements of FIGS. 5R-5U which resemble the structure and function of integrated circuit 500 as described in FIGS. 5A-5P have a same identifying numeral for convenience.

FIG. 5R is a cross-sectional view of integrated circuit 500 after performing operation 304, in accordance with some embodiments. FIG. 5R is presented for convenience, and a description of FIG. 5R corresponds to the description of FIG. 5E, above.

FIG. 5S is a cross-sectional view of integrated circuit 500 after performing operation 308, as described above. FIG. 5S is presented for convenience, and a description of FIG. 5S corresponds to the description of FIG. 5K, given above.

FIG. 5T is a cross-sectional view of an integrated circuit 500, wherein forming an opening through the insulating mask exposes part of the gate electrode 560B. In FIG. 5T, a layer of patterning material 540 has been deposited over the insulating mask (conformal insulating layer 516 and insulating material 518) and an opening 521 formed therein between dummy contacts 503A and 503B. Insulating material 518 and conformal insulating layer 516 have been removed from against gate electrode 560B within opening 521, and a conductive barrier layer 532 has been deposited between the dummy contacts 503A and 503B and directly against the gate electrode 560B. In some embodiments, the conductive barrier layer is a backside gate electrode contact electrically connected to the gate electrode 560B of the integrated circuit. According to some embodiments, the conductive barrier layer 532 comprises epitaxially grown semiconductor material such as silicon, silicon germanium, or other semiconductor materials used in the art. The conductive barrier layer protects the gate electrode 560B from contamination by diffusion of metal in an interconnect formed against a bottom side of the conductive barrier layer 532. In some embodiments, the conductive barrier layer is a deposited metal layer such as silicon, tungsten, titanium, cobalt, copper, nickel, platinum, palladium, and alloys thereof, as well as other metals compatible with the performance of method 300. In some embodiments, the conductive barrier layer is a metal nitride of metals such as silicon, tungsten, titanium, cobalt, nickel, platinum, palladium, and alloys thereof, as well as other metals compatible with the performance of method 300. In some embodiments, a dielectric barrier is deposited against the gate electrode 560B to prevent metals from diffusing into the gate electrode 560B. The dielectric barrier includes nitrides of materials such as silicon, tungsten, titanium, cobalt, copper, nickel, platinum, palladium, and alloys thereof, as well as other nitrides for use against the gate electrode.

In FIG. 5U, a conductive material layer 527 has been deposited against the layer of insulating material 518, the conductive barrier layer 532, and the conformal insulating layer 516. The layer of conductive material has been thinned such that the vertical dimension of the layer of conductive material is smaller than the vertical dimension of the dummy contact between the distal end of the dummy contact and the bottom end of the conductive barrier layer 532. A second layer of insulating material 519 has been deposited over the conductive material layer 527 and the backside interconnect 526. With the backside interconnect 526 located between the channel region 508 and the channel region 510, a signal through the backside interconnect 526 is able to trigger current flow through the channels in both the channel regions simultaneously.

Figure 6A:
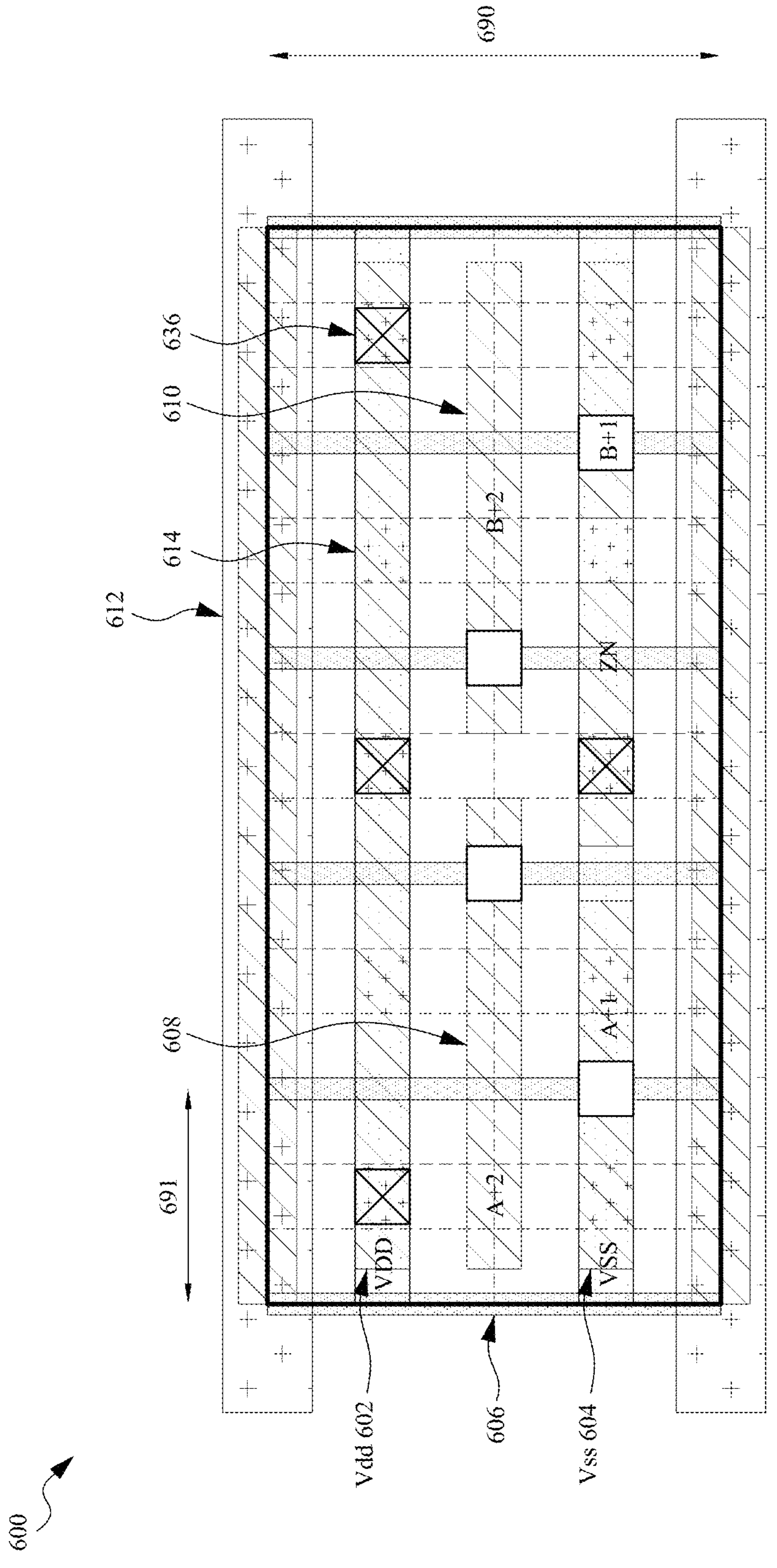
FIGS. 6A-6B are views of a layout of an integrated circuit, in accordance with some embodiments.
Figure 6B:
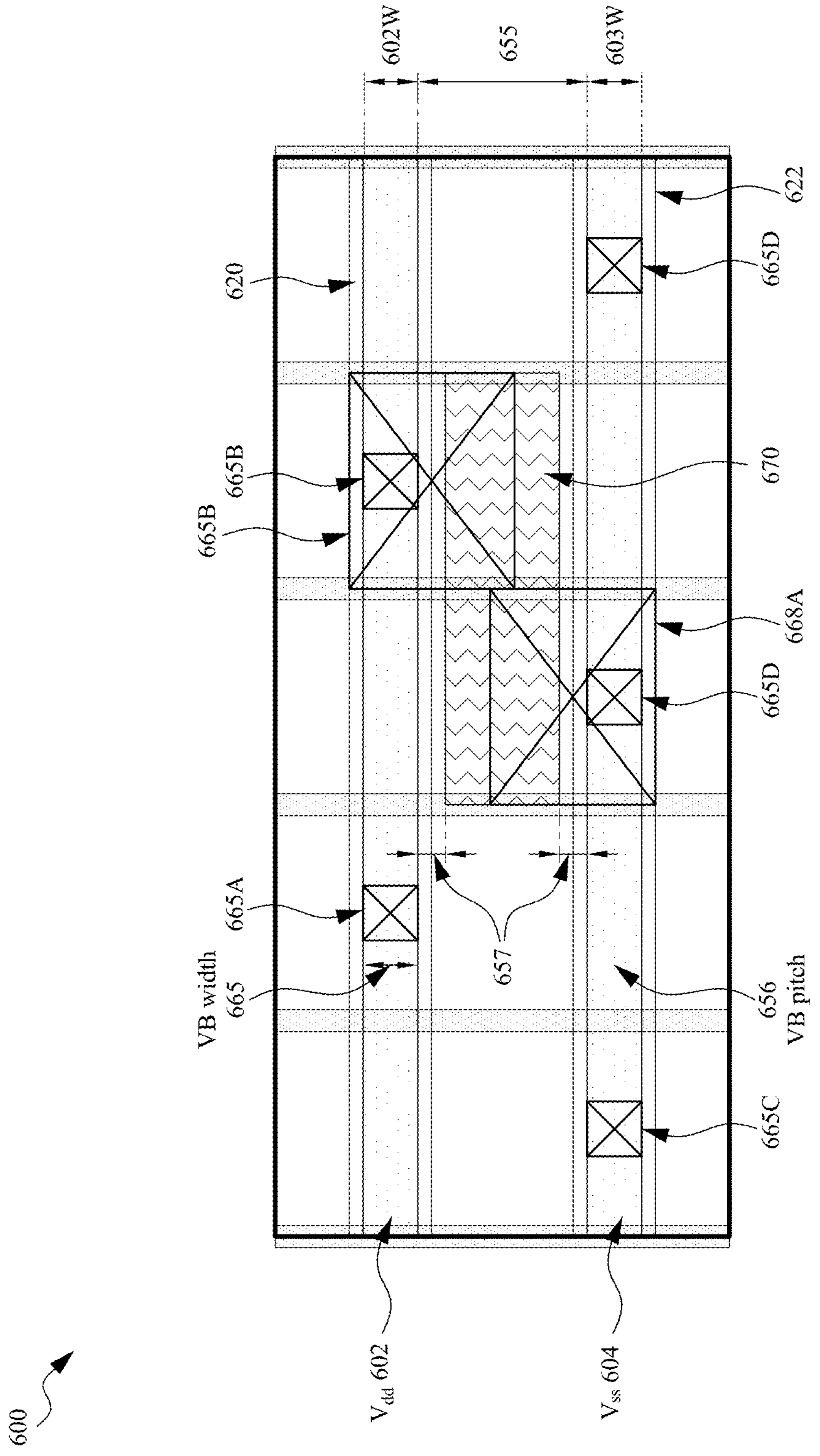

FIGS. 6A-6B are views of a layout of an integrated circuit 600, in accordance with some embodiments. FIG. 6A is a view of top side an integrated circuit layout, and FIG. 6B is a backside integrated circuit layout. In integrated circuit 600, a plurality of conductive lines 606 are positioned at a pitch interval 691 apart from each other along the length of a VDD line 602 and a VSS line 604. In some embodiments, the conductive lines are poly lines which extend across active areas of the integrated circuit. A first gate electrode 608 and a second gate electrode 610 are located in integrated circuit and are electrically connected to poly lines by topside contacts 609. The cell in integrated circuit 600 has a cell height 690 corresponding to the length of the conductive lines 606 in a direction perpendicular to the direction of the VDD line 602 and VSS line 604 of the integrated circuit. In integrated circuit 600, a plurality of source and drain regions electrically connected to the VDD and VSS line, but are omitted for clarity.

FIG. 6B, VDD line 602 and VSS line 604 extend horizontally across the integrated circuit, where a plurality of backside vias 665A, 665B are electrically connected to the VDD line 602, and a plurality of backside vias 665C, 665D, and 665B are electrically connected to the VSS line 604. A backside interconnect 670 extends in a same direction as the VDD line 602 and VSS line 604 and electrically connects backside via 665D to backside via 665B. In the integrated circuit, the active area adjacent to the VDD line 602 (first active area 620) has an active area with 602W. The space between the P-doped region and the N-doped region of the integrated circuit has a first height 655, and the second active area 622 has a second active area width 603W. According to some embodiments, the first active area 620 is an N-type active area, and the second active area is a P-type active area. First area 668A is an area of the insulating mask which is opened by an etch process to form the backside via 665D. Second area 668B is an area of the insulating mask which is opened by an etch process to form the backside via 665B.

Figure 7:
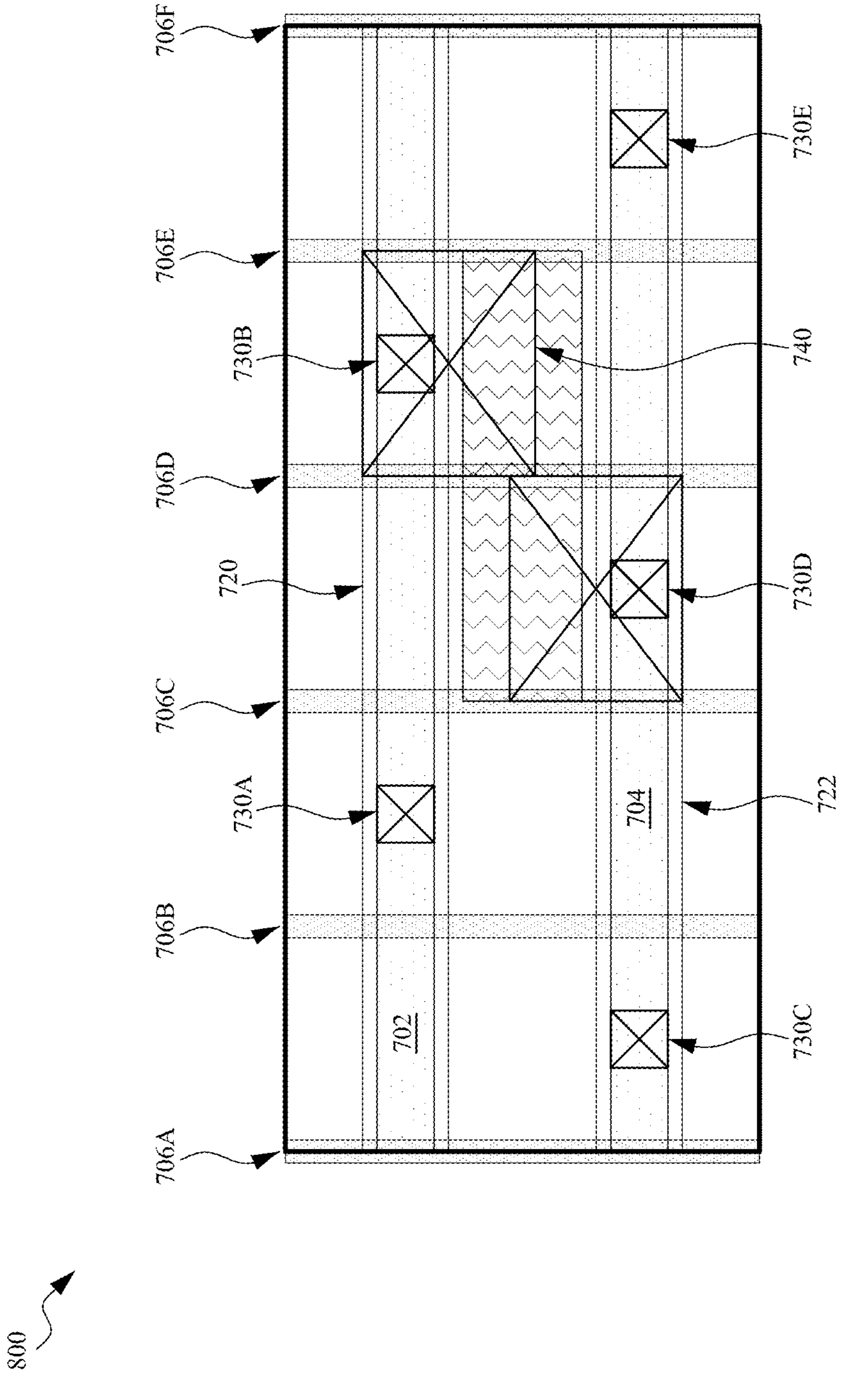
FIG. 7 is a view of a layout of an integrated circuit, in accordance with some embodiments.

FIG. 7 is a view of a layout of a backside of an integrated circuit 700 including a backside interconnect 740 therein. Backside interconnect 740 electrically connects backside contact 730B to backside contact 730D. Backside contact 730B is electrically connected to the VDD line 702, and backside contact 730D is electrically connected to the VSS line 704. Locations of poly lines 706 in the integrated circuit layout delineate the amount of space between backside contact 730B and backside contact 730D. In FIG. 7, the backside interconnect 740 electrically laterally connects to backside contacts on opposite sides of the backside interconnect. In some embodiments, backside interconnect electrically connects backside contacts to transistors on the same side of the backside interconnect.

Figure 8:
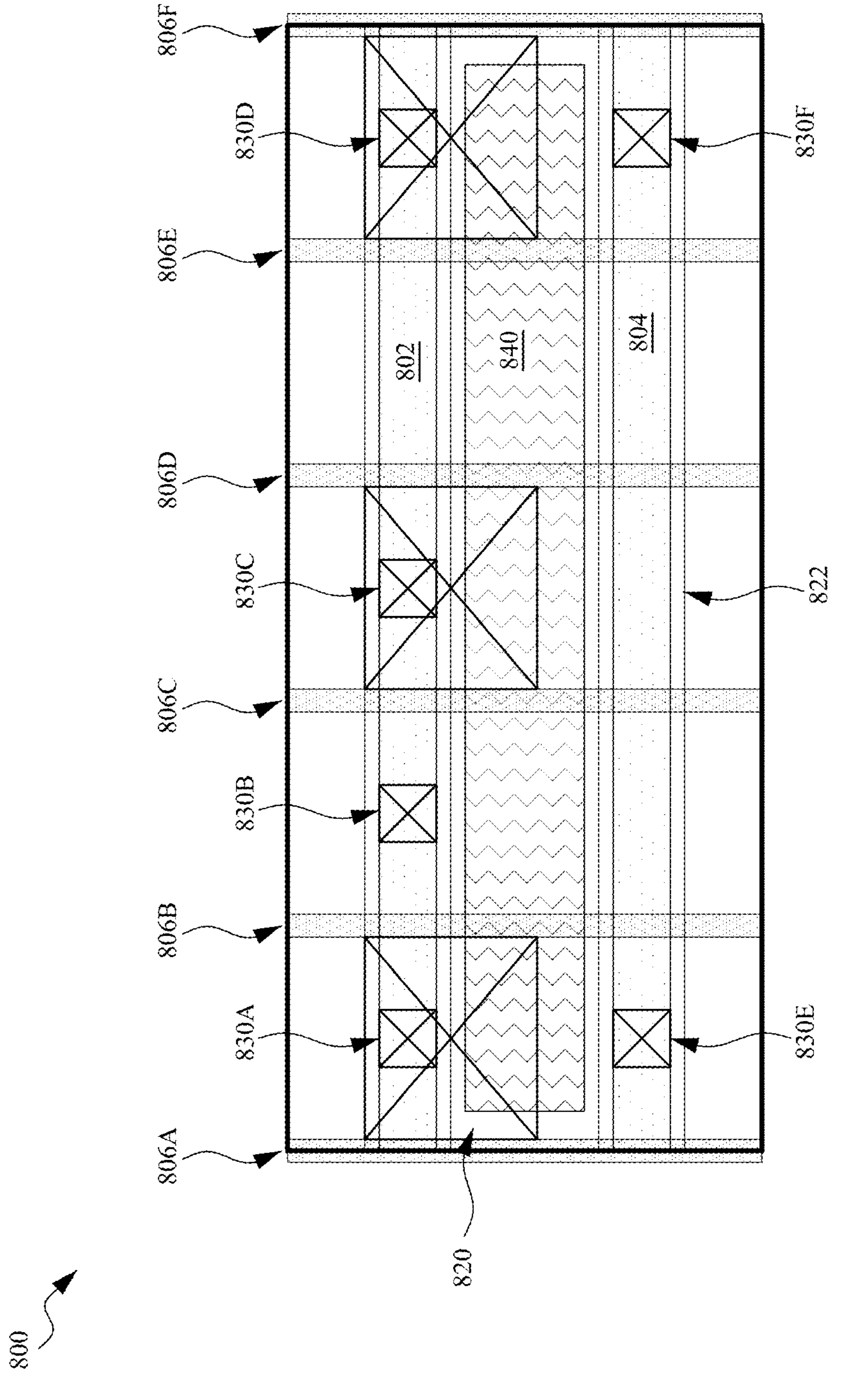
FIG. 8 is a view of a layout of an integrated circuit, in accordance with some embodiments.

FIG. 8 a view of a layout of a backside of an integrated circuit 800 having a backside interconnect 840 therein. VDD line 802 extends across the integrated circuit parallel to VSS line 804. Backside interconnect 840 extends in the same direction as VDD line 802 and VSS line 804 without making direct electrical contact either the VDD line or the VSS line. In integrated circuit 800, backside interconnect 840 is at a same level in the vertical structure of the integrated circuit has backside contacts 830A-830F. Backside interconnect 840 extends from about poly line 806A to about poly line 806F, crossing below poly lines 806B-806E. Backside interconnect 840 electrically connects backside contact 830A, backside contact 830C, and backside contact 830D. Backside contact 830B, backside contact 830E and backside contact 830F are electrically isolated from backside interconnect 840. In integrated circuit 800, all of the contacts electrically connected by backside interconnect 840 or on a same side of the backside interconnect 840 are all electrically connected to the same backside power rail: VDD line 802. In some embodiments, a backside interconnect connects multiple backside interconnects which alternatively connect to backside contacts on one side, then the opposite side, of the backside interconnect. In integrated circuit 800, backside contacts electrically connected by the backside interconnect are separated from each other by at least one poly line pitch as described above in FIG. 6A.

Figure 9:
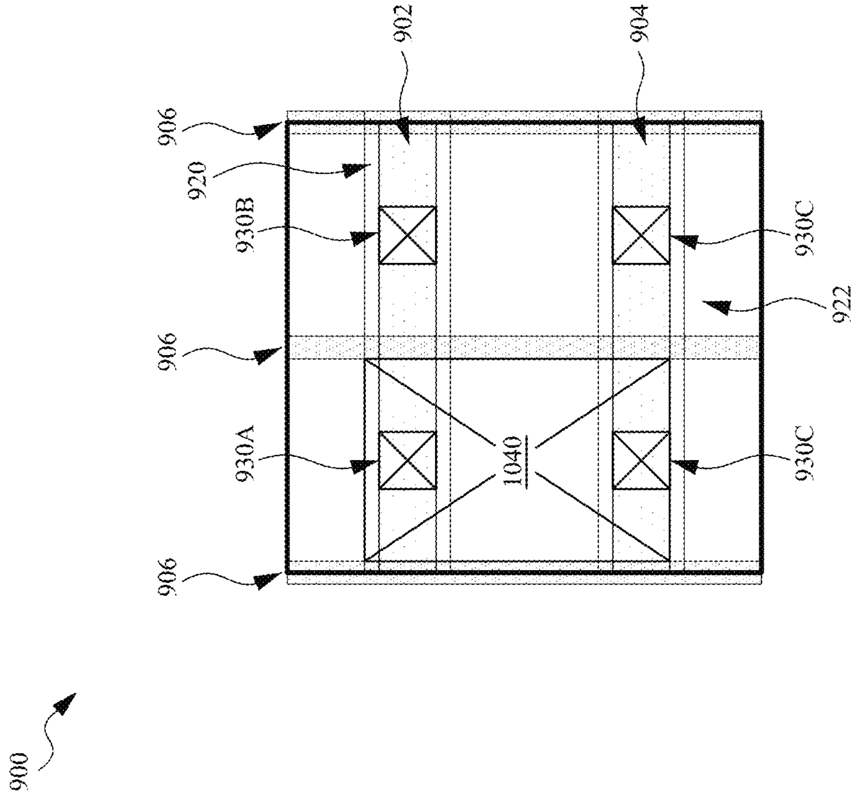
FIG. 9 is a view of a layout of an integrated circuit, in accordance with some embodiments.

FIG. 9 is a view of a layout of a backside of an integrated circuit 900, in accordance with some embodiments. In integrated circuit 900, backside interconnect 940 electrically connects backside contact 930A to backside contact 930C. Backside contact 930A and backside contact 930B are electrically connected to a VDD line 902, and backside contact 930C and backside contact 930D are electrically connected to a VSS line 904. A cross-sectional view of integrated circuit 900 resemble the cross-sectional view of integrated circuit 400 in FIG. 4O above, with the exception that backside interconnect 426 of integrated circuit 400 electrically connects both backside contact 4AA and backside contact 4BB.

Figure 10A:
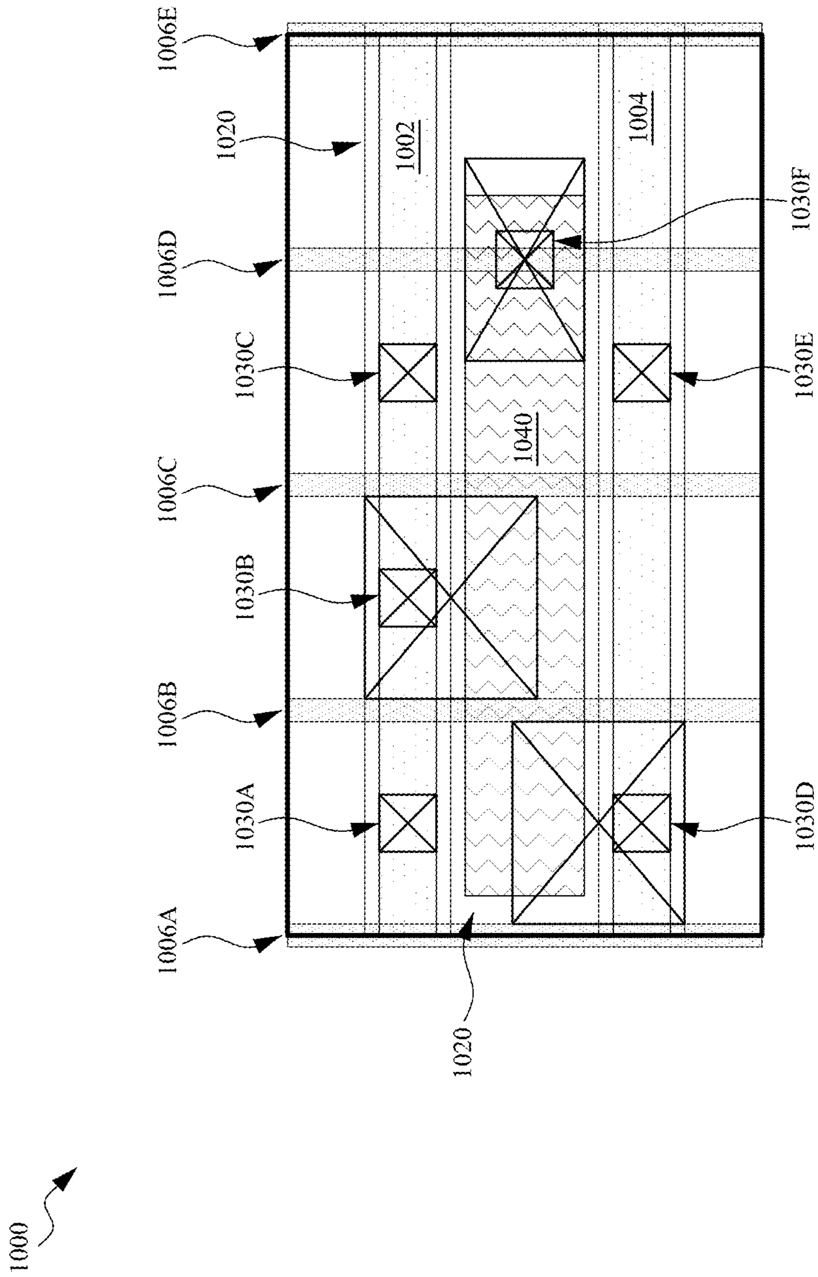
FIGS. 10A-10E are views of a layout of an integrated circuit, in accordance with some embodiments.

FIG. 10A is a view of a layout of a backside interconnect of an integrated circuit 1000 having a backside interconnect electrically connecting one or more S/D regions to a gate electrode of the integrated circuit, in accordance with some embodiments. Elements of integrated circuit 1000 have a same function and structure as elements of integrated circuit 900 have a same identifying numeral, incremented by 100.

In integrated circuit 1000, backside interconnect 1040 electrically connects backside contact 1030D and backside contact 1030B to gate electrode contact 1030F. According to some embodiments, backside contact 1030D and backside contact 1030B are on a same side of the backside interconnect. In some embodiments, multiple backside contacts on both sides of the backside interconnect are electrically connected to the backside interconnect. In some embodiments, the gate electrode contact 1030F is a conductive barrier layer as described above in FIGS. 5R-5U (see, conductive barrier layer 532).

Figure 10C:
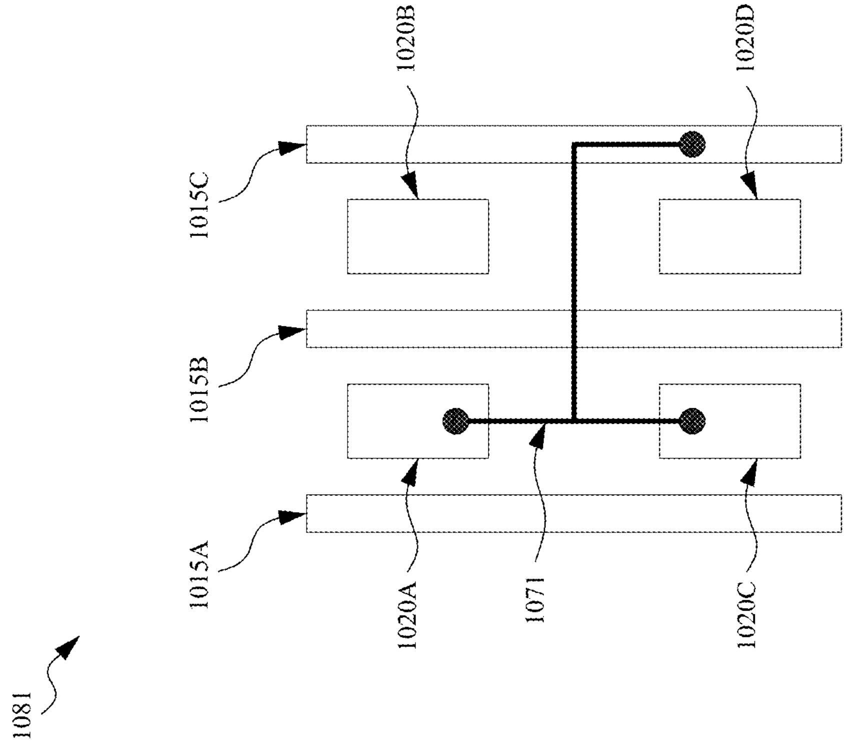
Figure 10B:
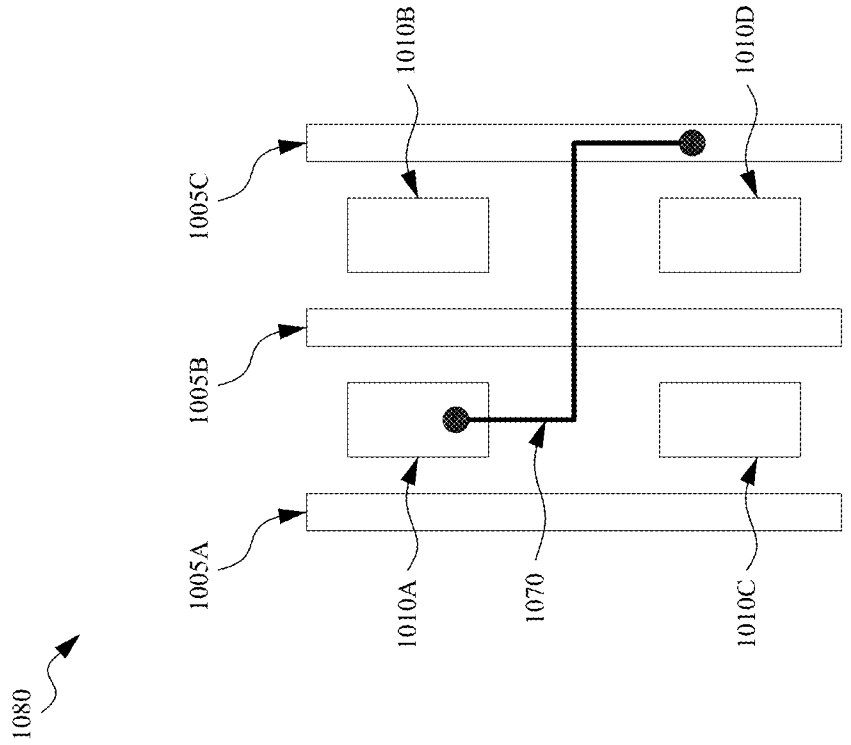

FIG. 10B is a view of a layout of an integrated circuit 1080, in accordance with some embodiments. Integrated circuit 1080 includes gate electrodes 1005A-1005C and source/drain regions 1010A-1010D. Backside interconnect 1070 electrically connects source/drain region 1010A to gate electrode 1005C and traverses, without connecting to, gate electrode 1005B.

FIG. 10C is a view of a layout of an integrated circuit 1081, in accordance with some embodiments. Elements of integrated circuit 1081 which have a same structure and function as elements of integrated circuit 1080 have a same identifying numeral, incremented by 10. In integrated circuit 1081, backside interconnect 1071 electrically connects to first source/drain region 1020A and second source/drain region 1020C, and traverses, without connecting to, gate electrode 1015B to electrically connect to gate electrode 1015C.

Figure 10D:
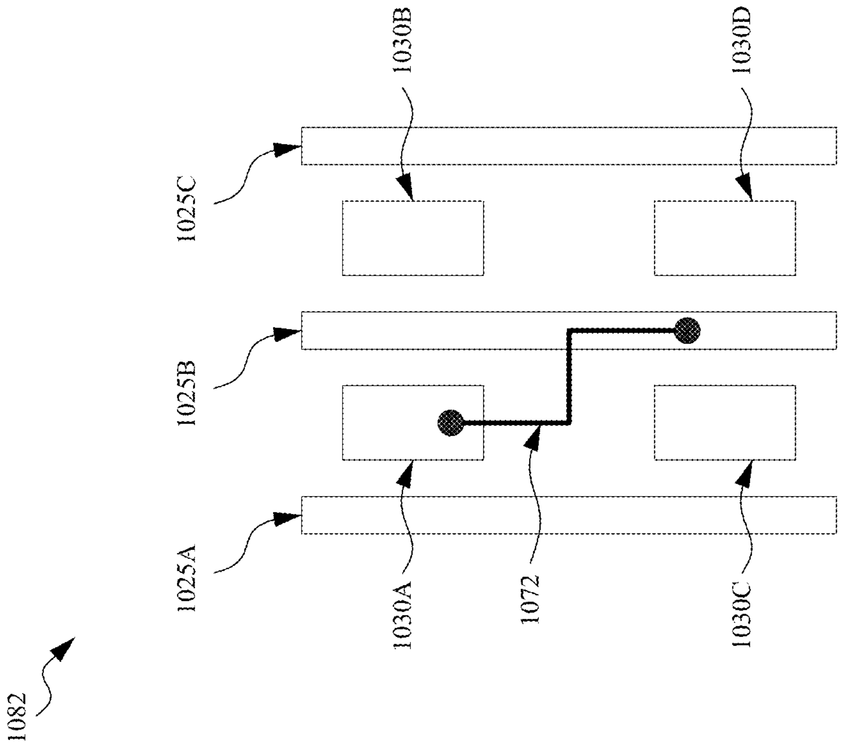

FIG. 10D is a view of a layout of an integrated circuit 1082, in accordance with some embodiments. Elements of integrated circuit 1082 which have a same structure and function as elements of integrated circuit 1080 have a same identifying numeral, incremented by 20. In integrated circuit 1082, backside interconnect 1073 electrically connects to first source/drain region 1030A to gate electrode 1025B without traversing below any other gate electrodes of the integrated circuit.

Figure 10E:
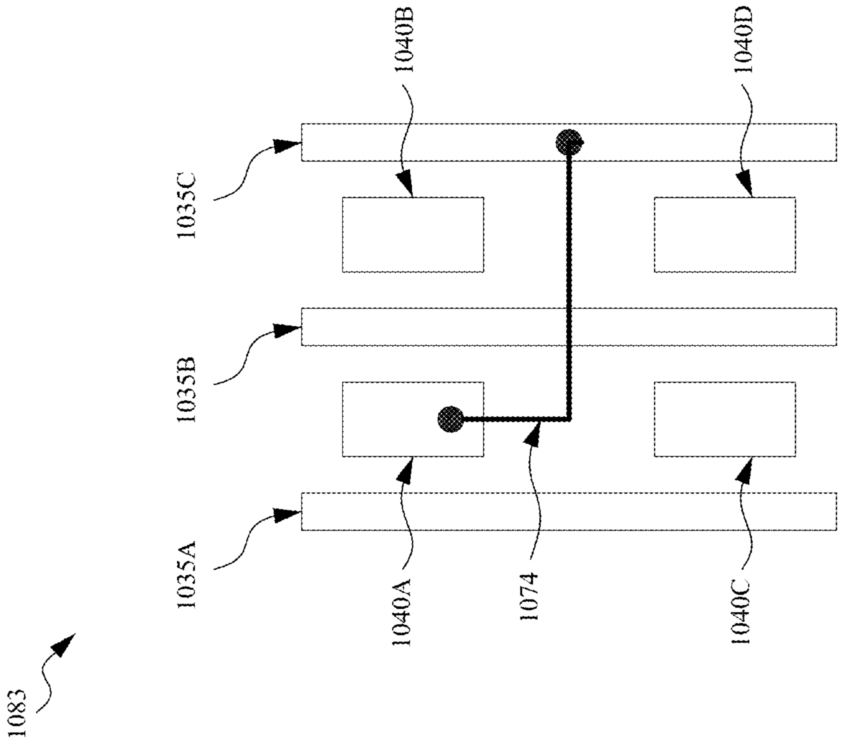

FIG. 10E is a view of a layout of integrated circuit 1083, in accordance with some embodiments. Elements of integrated circuit 1083 which have a same structure and function as elements of integrated circuit 1080 have a same identifying numeral, incremented by 30. In integrated circuit 1083, backside interconnect 1074 electrically connects a single gate electrode, gate electrode 1035C, to a single S/D region, source/drain region 1040A, and traverses below, but does not electrically connect to, gate electrode 1035B which is between gate electrode 1035C and source/drain region 1040A.

Figure 11:
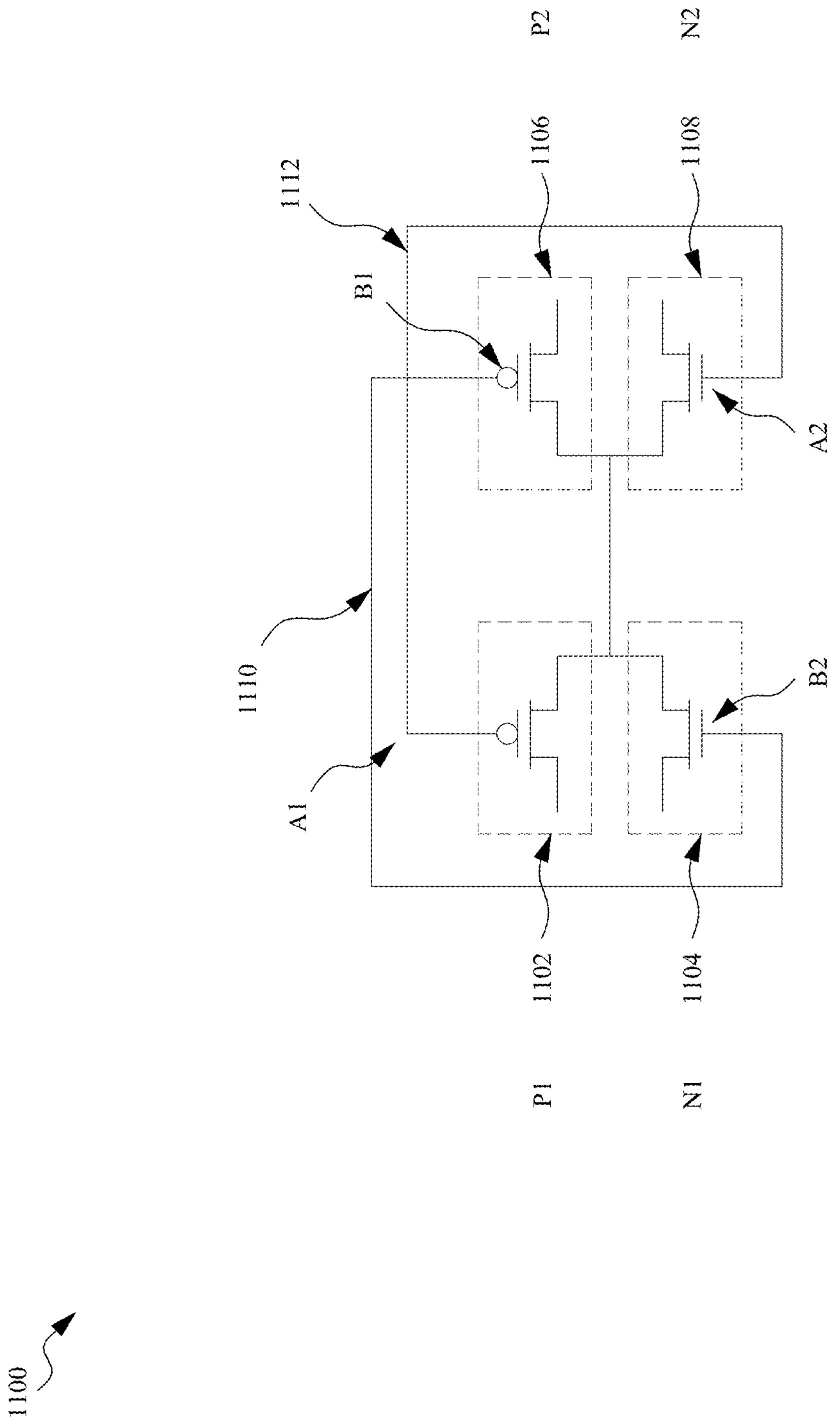
FIG. 11 is a circuit diagram of a transmission gate of an integrated circuit, in accordance with some embodiments.

FIG. 11 is a circuit diagram of a transmission gate 1100 of an integrated circuit, in accordance with some embodiments. A transmission gate with a topside interconnect between two transistors, and a backside interconnect between the other two transistors, uses less area in an integrated circuit layout than a transmission gate which connects the pairs of transistors in the same layer of a topside interconnect structure. Further, a transmission gate with both top and backside interconnections is less prone to defects which would make the device inoperable. Transmission gate 1100 includes a first P-type transistor 1102, a second P-type transistor 1106, a first N-type transistor 1104, and a second N-type transistor 1108. The gate electrode A1 of the first P-type transistor 1102 is electrically connected to the gate electrode A2 of second N-type transistor 1108 by a top-side interconnect according to embodiments known in the art. In some embodiments, the connection between the gate electrode of the first P-type transistor 1102 and the gate electrode of the second N-type transistor 1108 includes a first gate electrode contact to the first P-type transistor, a second gate electrode contact to the second N-type transistor, and a metal line (metal zero line) spanning the space between the first gate electrode contact and the second gate electrode contact.

The gate electrode B1 of the second P-type transistor 1106 is electrically connected to the gate electrode B2 of first N-type transistor 1104 by a backside interconnect according to embodiments known in the art. In some embodiments, the connection between the gate electrode of the second P-type transistor and the gate electrode of the first N-type transistor includes a first backside contact to the second P-type transistor gate electrode, a second backside contact to the first N-type transistor, and a backside contact spanning the space between the first backside contact and the second backside contact.

Figure 12:
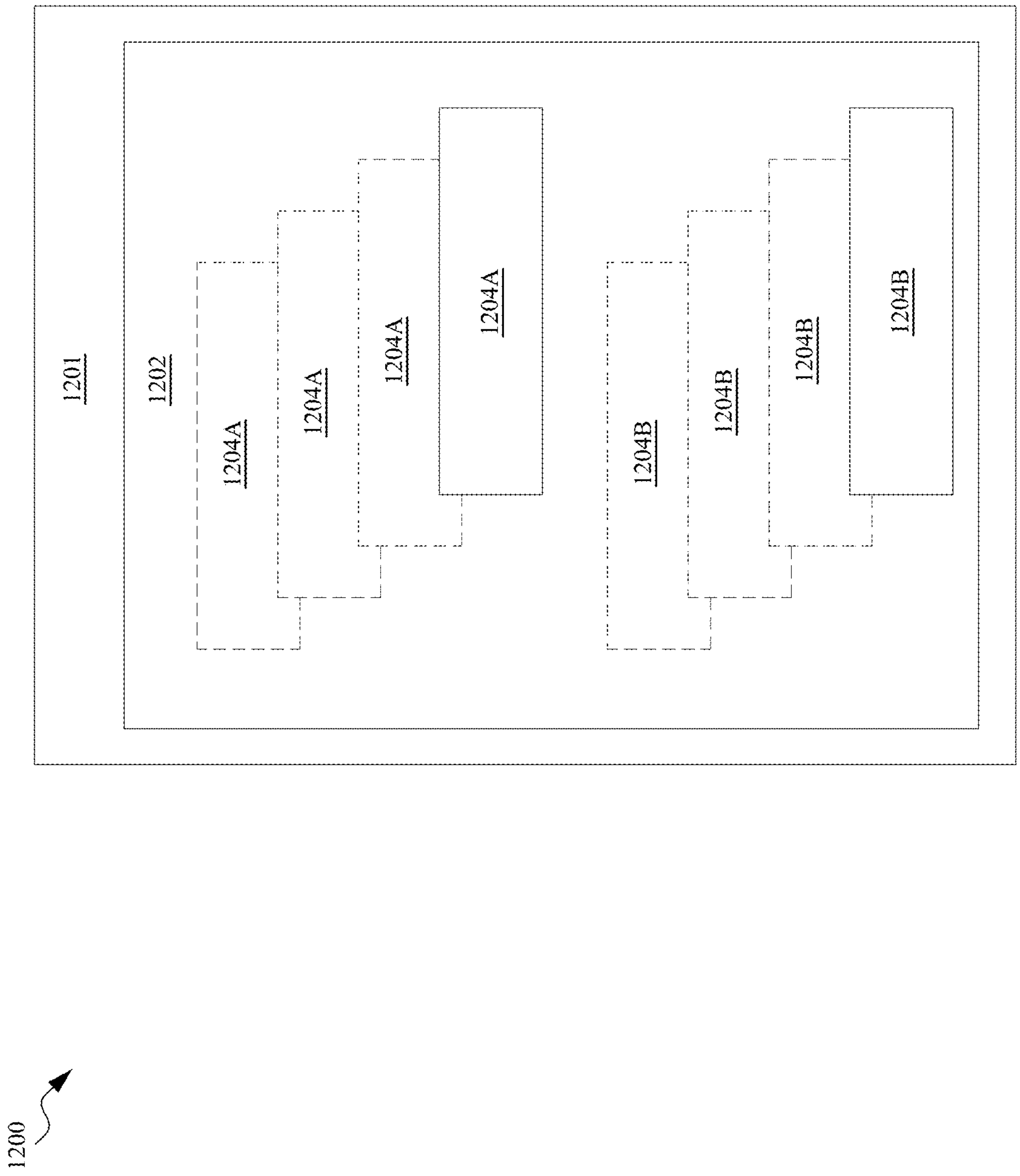
FIG. 12 is a block diagram of a semiconductor device in accordance with some embodiments.

FIG. 12 is a block diagram of a semiconductor device 1200 in accordance with at least one embodiment of the present disclosure.

In FIG. 12, semiconductor device 1200 includes, among other things, a substrate 1201 having thereon a circuit macro (hereinafter, macro) 1202. In some embodiments, macro 1202 is a backside interconnect arrangement between multiple backside contacts to drains of the semiconductor device 1200. In some embodiments, macro 1202 is a macro other than an SRAM macro. Macro 1202 includes, among other things, a wire routing arrangement 1204. Example of layout diagrams resulting in wire routing arrangement 1204 include the routing arrangement layout diagrams in each of each of FIGS. 6A-11.

Figure 13:
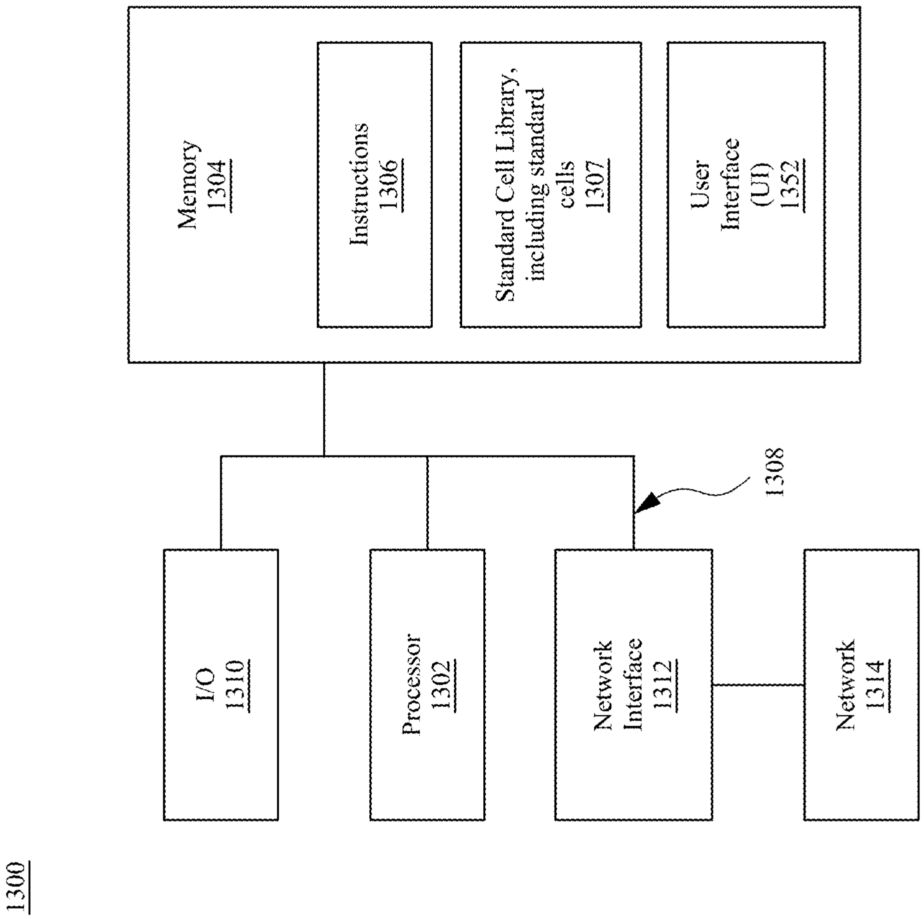
FIG. 13 is a block diagram of an electronic design automation (EDA) system in accordance with some embodiments.

FIG. 13 is a block diagram of an electronic design automation (EDA) system 1300 in accordance with some embodiments.

In some embodiments, EDA system 1300 is a general purpose computing device including a hardware processor 1302 and a non-transitory, computer-readable storage medium (storage medium 1304). Computer readable storage medium 1304, amongst other things, is encoded with, i.e., stores, computer program code 1306, i.e., a set of computer-executable instructions (instructions). Execution of computer program code 1306 by hardware processor 1302 represents (at least in part) an EDA tool which implements a portion or all of, e.g., the methods described herein in accordance with one or more (hereinafter, the noted processes and/or methods).

Hardware processor 1302 is electrically coupled to computer-readable storage medium 1304 via a bus 1308. Hardware processor 1302 is also electrically coupled to an I/O interface 1310 by bus 1308. A network interface 1312 is also electrically connected to hardware processor 1302 via bus 1308. Network interface 1312 is connected to a network 1314, so that hardware processor 1302 and computer-readable storage medium 1304 are capable of connecting to external elements via network 1314. Hardware processor 1302 is configured to execute computer program code 1306 encoded in computer-readable storage medium 1304 in order to cause EDA system 1300 to be usable for performing a portion or all of the noted processes and/or methods. In one or more embodiments, hardware processor 1302 is a central processing unit (CPU), a multi-processor, a distributed processing system, an application specific integrated circuit (ASIC), and/or a suitable processing unit.

In one or more embodiments, computer-readable storage medium 1304 is an electronic, magnetic, optical, electromagnetic, infrared, and/or a semiconductor system (or apparatus or device). For example, computer-readable storage medium 1304 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1304 includes a compact disk-read only memory (CD-ROM), a compact disk-read/write (CD-R/W), and/or a digital video disc (DVD).

In one or more embodiments, computer readable storage medium 1304 stores computer program code 1306 configured to cause EDA system 1300 (where such execution represents (at least in part) the EDA tool) to be usable for performing a portion or all of the noted processes and/or methods. In one or more embodiments, computer readable storage medium 1304 also stores information which facilitates performing a portion or all of the noted processes and/or methods. In one or more embodiments, computer readable storage medium 1304 stores a library 1307 of standard cells including such standard cells as disclosed herein.

EDA system 1300 includes I/O interface 1310. I/O interface 1310 is coupled to external circuitry. In one or more embodiments, I/O interface 1310 includes a keyboard, keypad, mouse, trackball, trackpad, touchscreen, and/or cursor direction keys for communicating information and commands to hardware processor 1302.

EDA system 1300 also includes network interface 1312 coupled to hardware processor 1302. Network interface 1312 allows EDA system 1300 to communicate with network 1314, to which one or more other computer systems are connected. Network interface 1312 includes wireless network interfaces such as BLUETOOTH, WIFI, WiMAX, GPRS, or WCDMA; or wired network interfaces such as ETHERNET, USB, or IEEE-1364. In one or more embodiments, a portion or all of noted processes and/or methods, is implemented in two or more EDA systems 1300.

EDA system 1300 is configured to receive information through I/O interface 1310. The information received through I/O interface 1310 includes one or more of instructions, data, design rules, libraries of standard cells, and/or other parameters for processing by hardware processor 1302. The information is transferred to hardware processor 1302 via bus 1308. EDA system 1300 is configured to receive information related to a UI through I/O interface 1310. The information is stored in computer-readable storage medium 1304 as user interface (UI) 1352.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1300. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 14:
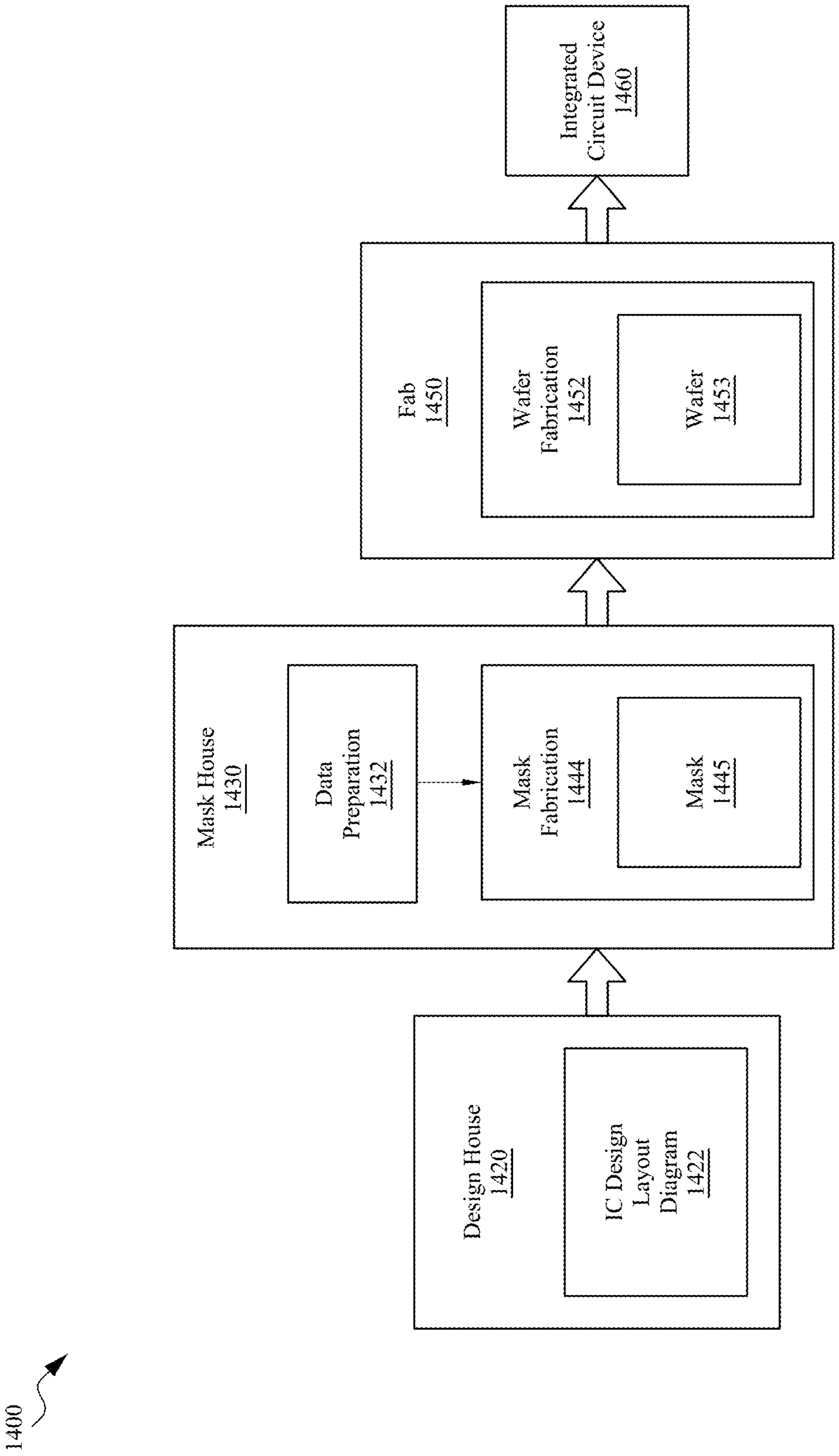
FIG. 14 is a block diagram of an integrated circuit (IC) manufacturing system, and an IC manufacturing flow associated therewith, in accordance with some embodiments.

FIG. 14 is a block diagram of an integrated circuit (IC) manufacturing system 1400, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 1400.

In FIG. 14, IC manufacturing system 1400 includes entities, such as a design house 1420, a mask house 1430, and an IC manufacturer/fabricator ("fab") 1450, that interact with one another in the design, development, and manufacturing cycles and/or services related to manufacturing an IC device 1460. The entities in IC manufacturing system 1400 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1420, mask house 1430, and IC fab 1450 is owned by a single larger company. In some embodiments, two or more of design house 1420, mask house 1430, and IC fab 1450 coexist in a common facility and use common resources.

Design house (or design team) 1420 generates an IC design layout diagram 1422. IC design layout diagram 1422 includes various geometrical patterns designed for an IC device 1460. The geometrical patterns correspond to patterns of metal, oxide, or semiconductor layers that make up the various components of IC device 1460 to be fabricated. The various layers combine to form various IC features. For example, a portion of IC design layout diagram 1422 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1420 implements a proper design procedure to form IC design layout diagram 1422. The design procedure includes one or more of logic design, physical design or place and route. IC design layout diagram 1422 is presented in one or more data files having information of the geometrical patterns. For example, IC design layout diagram 1422 can be expressed in a GDSII file format or DFII file format.

Mask house 1430 includes mask data preparation 1432 and mask fabrication 1444. Mask house 1430 uses IC design layout diagram 1422 to manufacture one or more masks 1445 to be used for fabricating the various layers of IC device 1460 according to IC design layout diagram 1422. Mask house 1430 performs mask data preparation 1432, where IC design layout diagram 1422 is translated into a representative data file ("RDF"). Mask data preparation 1432 provides the RDF to mask fabrication 1444. Mask fabrication 1444 includes a mask writer. A mask writer converts the RDF to an image on a substrate, such as a mask (reticle) 1445 or a semiconductor wafer 1453. The IC design layout diagram 1422 is manipulated by mask data preparation 1432 to comply with particular characteristics of the mask writer and/or requirements of IC fab 1450. In FIG. 14, mask data preparation 1432 and mask fabrication 1444 are illustrated as separate elements. In some embodiments, mask data preparation 1432 and mask fabrication 1444 can be collectively referred to as mask data preparation.

In some embodiments, mask data preparation 1432 includes optical proximity correction (OPC) which uses lithography enhancement techniques to compensate for image errors, such as those that can arise from diffraction, interference, other process effects and the like. OPC adjusts IC design layout diagram 1422. In some embodiments, mask data preparation 1432 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1432 includes a mask rule checker (MRC) that checks the IC design layout diagram 1422 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1422 to compensate for limitations during mask fabrication 1444, which may undo part of the modifications performed by OPC in order to meet mask creation rules.

In some embodiments, mask data preparation 1432 includes lithography process checking (LPC) that simulates processing that will be implemented by IC fab 1450 to fabricate IC device 1460. LPC simulates this processing based on IC design layout diagram 1422 to create a simulated manufactured device, such as IC device 1460. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1422.

It should be understood that the above description of mask data preparation 1432 has been simplified for the purposes of clarity. In some embodiments, mask data preparation 1432 includes additional features such as a logic operation (LOP) to modify the IC design layout diagram 1422 according to manufacturing rules. Additionally, the processes applied to IC design layout diagram 1422 during mask data preparation 1432 may be executed in a variety of different orders.

After mask data preparation 1432 and during mask fabrication 1444, a mask 1445 or a group of masks 1445 are fabricated based on the modified IC design layout diagram 1422. In some embodiments, mask fabrication 1444 includes performing one or more lithographic exposures based on IC design layout diagram 1422. In some embodiments, an electron-beam (e-beam) or a mechanism of multiple e-beams is used to form a pattern on a mask (photomask or reticle) 1445 based on the modified IC design layout diagram 1422. Mask 1445 can be formed in various technologies. In some embodiments, mask 1445 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1445 includes a transparent substrate (e.g., fused quartz) and an opaque material (e.g., chromium) coated in the opaque regions of the binary mask. In another example, mask 1445 is formed using a phase shift technology. In a phase shift mask (PSM) version of mask 1445, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1444 is used in a variety of processes. For example, such a mask(s) is used in an ion implantation process to form various doped regions in semiconductor wafer 1453, in an etching process to form various etching regions in semiconductor wafer 1453, and/or in other suitable processes.

IC fab 1450 includes wafer fabrication 1452. IC fab 1450 is an IC fabrication business that includes one or more manufacturing facilities for the fabrication of a variety of different IC products. In some embodiments, IC fab 1450 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1450 uses mask(s) 1445 fabricated by mask house 1430 to fabricate IC device 1460. Thus, IC fab 1450 at least indirectly uses IC design layout diagram 1422 to fabricate IC device 1460. In some embodiments, semiconductor wafer 1453 is fabricated by IC fab 1450 using mask(s) 1445 to form IC device 1460. In some embodiments, the IC fabrication includes performing one or more lithographic exposures based at least indirectly on IC design layout diagram 1422. Semiconductor wafer 1453 includes a silicon substrate or other proper substrate having material layers formed thereon. Semiconductor wafer 1453 further includes one or more of various doped regions, dielectric features, multilevel interconnects, and the like (formed at subsequent manufacturing steps).

Details regarding an integrated circuit (IC) manufacturing system (e.g., IC manufacturing system 1400 of FIG. 14), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

Aspects of the present disclosure relate to a method of making an integrated circuit, which includes operations of etching an opening in an insulating mask to expose a first dummy contact on a backside of the integrated circuit; depositing a conductive material into the opening, wherein the conductive material contacts a sidewall of the first dummy contact; recessing the conductive material to expose an end of the first dummy contact; depositing an insulating material over the conductive material in the opening; removing the first dummy contact from the insulating mask to form a first contact opening; and forming a first conductive contact in the first contact opening, the first conductive contact being electrically connected to the conductive material in the opening. In some embodiments, manufacturing an insulating mask further includes etching a support material to form the first dummy contact; and depositing a first dielectric material against sidewalls of the first dummy contact. In some embodiments, the method includes operations of growing a first drain region and a second drain region of the integrated circuit by epitaxial growth, wherein the first drain region is grown with an epitaxial material at a first area on an exposed end of the first dummy contact, and the second drain region is grown with the epitaxial material at a second area on the exposed end of the first dummy contact; and thinning the support material to expose the first dummy contact and the first dielectric material. In some embodiments, the method includes an operation of removing the first dielectric material to expose sidewalls of the first dummy contact. In some embodiments, the method includes an operation of depositing a spacer on the sidewalls of the first dummy contact. In some embodiments the method includes trimming the first drain region and the second drain region, such that a sidewall of the spacer on the first dummy contact aligns with a sidewall of the first drain region and a sidewall of the second drain region. In some embodiments, the method includes exposing the first dummy contact by etching the first dielectric material; depositing a conformal insulating layer over the first dummy contact; depositing a first insulating layer over the conformal insulating layer in the opening; and exposing a sidewall of the first dummy contact in the opening directly below the first drain region. In some embodiments, the method includes forming an interconnect structure against the first dummy contact in the opening. In some embodiments, the method includes depositing a top insulating layer over the interconnect structure.

Aspects of the present disclosure relate to a method of making an integrated circuit. The method includes etching a plurality of contact openings in an insulating material, wherein each of the plurality of contact openings exposes a corresponding source/drain (S/D) region of a plurality of S/D regions. The method further includes filling each of the plurality of contact openings with a dummy material to define a plurality of dummy contacts. The method further includes removing the insulating material. The method further includes depositing a spacer material along sidewalls of each of the plurality of dummy contacts. The method further includes removing the spacer material from a first sidewall of the sidewalls of a first dummy contact of the plurality of dummy contacts. The method further includes depositing a conductive material in direct contact with the first sidewall of the first dummy contact. The method further includes replacing the first dummy contact with a conductive contact. In some embodiments, the method further includes maintaining the spacer material along a second sidewall of the sidewalls of the first dummy contact during the removing the spacer material from the first sidewall of the first dummy contact. In some embodiments, depositing the conductive material includes depositing the conductive material separated from the second sidewall of the first dummy contact by the spacer material. In some embodiments, the method further includes maintaining the spacer material along both sidewalls of the sidewalls of a second dummy contact of the plurality of dummy contacts during the removing the spacer material from the first sidewall of the first dummy contact. In some embodiments, depositing the conductive material includes depositing the conductive material separated from the sidewalls of the second dummy contact by the spacer material. In some embodiments, the method further includes removing a portion of the conductive material, wherein a top-most surface of the conductive material following the removal is below a top-most surface of the first dummy contact. In some embodiments, the method further includes depositing a dielectric material over the conductive material following the removal of the portion of the conductive material, wherein a top-most surface of the dielectric material is co-planar with the top-most surface of the first dummy contact. In some embodiments, depositing the dielectric material includes depositing the dielectric material in direct contact with the first sidewall of the first dummy contact.

Aspects of this description relate to a method of making an integrated circuit. The method further includes forming a plurality of dummy contacts, wherein each of the plurality of dummy contacts lands on a corresponding source/drain (S/D) region of a plurality of S/D regions. The method further includes forming a conductive line in direct contact with a first sidewall of a first dummy contact of the plurality of dummy contacts, wherein the conductive line is separated from sidewalls of a second dummy contact of the plurality of dummy contacts. The method further includes replacing each of the plurality of dummy contacts with a corresponding conductive contact of a plurality of conductive contacts. The method further includes recessing a first conductive contact of the plurality of conductive contacts. The method further includes depositing an insulating material over the first conductive contact. The method further includes forming a plurality of power rails, wherein each of the plurality of power rails is over a corresponding conductive contact of the plurality of conductive contacts, and the insulating material is between a first power rail of the plurality of power rails and the first conductive contact. In some embodiments, forming the plurality of power rails includes electrically connecting a second power rail of the plurality of power rails to a second conductive contact of the plurality of conductive contacts. In some embodiments, the method further includes planarizing the insulating material over the first conductive contact to define a top-most surface of the insulating material co-planar with a top-most surface of a second conductive contact of the plurality of conductive contacts.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making an integrated circuit, comprising:
- etching an opening in an insulating mask to expose a first dummy contact on a backside of the integrated circuit;
- depositing a conformal insulating layer against a sidewall of the first dummy contact;
- depositing a conductive material into the opening through an opening formed in the conformal insulating layer, wherein the conductive material contacts the sidewall of the first dummy contact;
- recessing the conductive material to expose an end of the first dummy contact;
- depositing an insulating material over the conductive material in the opening, wherein the insulating material contacts the first dummy contact;
- removing the first dummy contact from the insulating mask to form a first contact opening; and
- forming a first conductive contact in the first contact opening, wherein a sidewall of the first conductive contact contacts the conductive material in the opening.

2. The method of claim 1, further comprising:
- etching a support material to form the first dummy contact; and
- depositing a first dielectric material against sidewalls of the first dummy contact.

3. The method of claim 2, further comprising:
- growing a first drain region and a second drain region of the integrated circuit by epitaxial growth, wherein the first drain region is grown with an epitaxial material at a first area on an exposed end of the first dummy contact, and the second drain region is grown with the epitaxial material at a second area on the exposed end of the first dummy contact; and
- thinning the support material to expose the first dummy contact and the first dielectric material.

4. The method of claim 3, further comprising removing the first dielectric material to expose sidewalls of the first dummy contact.

5. The method of claim 4, further comprising depositing a spacer on the sidewalls of the first dummy contact.

6. The method of claim 5, further comprising trimming the first drain region and the second drain region, such that a sidewall of the spacer on the first dummy contact aligns with a sidewall of the first drain region and a sidewall of the second drain region.

7. The method of claim 2, further comprising
- exposing the first dummy contact by etching the first dielectric material;
- depositing a conformal insulating layer over the first dummy contact;
- depositing a first insulating layer over the conformal insulating layer in the opening; and
- exposing a sidewall of the first dummy contact in the opening directly below a first drain region.

8. The method of claim 7, further comprising forming an interconnect structure against the first dummy contact in the opening.

9. The method of claim 8, further comprising depositing a top insulating layer over the interconnect structure.

10. A method of making an integrated circuit comprising:

etching a plurality of contact openings in an insulating material, wherein each of the plurality of contact openings exposes a corresponding source/drain (S/D) region of a plurality of S/D regions;

filling each of the plurality of contact openings with a dummy material to define a plurality of dummy contacts;

removing the insulating material;

after removing the insulating material, depositing a spacer material along on exposed sidewalls of each of the plurality of dummy contacts;

removing the spacer material from a first sidewall of the sidewalls of a first dummy contact of the plurality of dummy contacts;

depositing a conductive material in direct contact with the first sidewall of the first dummy contact; and replacing the first dummy contact with a conductive contact.

11. The method of claim 10, further comprising maintaining the spacer material along a second sidewall of the sidewalls of the first dummy contact during the removing the spacer material from the first sidewall of the first dummy contact.

12. The method of claim 11, wherein depositing the conductive material comprises depositing the conductive material separated from the second sidewall of the first dummy contact by the spacer material.

13. The method of claim 10, further comprising maintaining the spacer material along both sidewalls of the sidewalls of a second dummy contact of the plurality of dummy contacts during the removing the spacer material from the first sidewall of the first dummy contact.

14. The method of claim 13, wherein depositing the conductive material comprises depositing the conductive material separated from the sidewalls of the second dummy contact by the spacer material.

15. The method of claim 10, further comprising removing a portion of the conductive material, wherein a top-most surface of the conductive material following the removal is below a top-most surface of the first dummy contact.

16. The method of claim 15, further comprising depositing a dielectric material over the conductive material following the removal of the portion of the conductive material, wherein a top-most surface of the dielectric material is co-planar with the top-most surface of the first dummy contact.

17. The method of claim 16, wherein depositing the dielectric material comprises depositing the dielectric material in direct contact with the first sidewall of the first dummy contact.

18. A method of making an integrated circuit comprising:

forming a plurality of dummy contacts, wherein each of the plurality of dummy contacts lands on a corresponding source/drain (S/D) region of a plurality of S/D regions;

forming a conductive line in direct contact with a first sidewall of a first dummy contact of the plurality of dummy contacts, wherein the conductive line is separated from sidewalls of a second dummy contact of the plurality of dummy contacts;

replacing each of the plurality of dummy contacts with a corresponding conductive contact of a plurality of conductive contacts, wherein each conductive contact of the plurality of conductive contacts is discontinuous with respect to at least one other conductive contact of the plurality of conductive contacts;

recessing a first conductive contact of the plurality of conductive contacts;

depositing an insulating material over the first conductive contact;

forming an isolation plug at a distal end of the first conductive contact, wherein the isolation plug electrically isolates the first conductive contact from the first power rail; and forming a plurality of power rails, wherein each of the plurality of power rails is over a corresponding conductive contact of the plurality of conductive contacts, and the insulating material is between a first power rail of the plurality of power rails and the first conductive contact.

19. The method of claim 18, wherein forming the plurality of power rails comprises electrically connecting a second power rail of the plurality of power rails to a second conductive contact of the plurality of conductive contacts.

20. The method of claim 19, further comprising planarizing the insulating material over the first conductive contact to define a top-most surface of the insulating material co-planar with a top-most surface of a second conductive contact of the plurality of conductive contacts.

* * * * *